(12) United States Patent  
Luan

(10) Patent No.: US 12,266,636 B2  
(45) Date of Patent: Apr. 1, 2025

(54) STACKED DIE PACKAGE INCLUDING A MULTI-CONTACT INTERCONNECT

(71) Applicant: STMICROELECTRONICS PTE LTD, Singapore (SG)

(72) Inventor: Jing-En Luan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 117 days.

(21) Appl. No.: 17/556,547

(22) Filed: Dec. 20, 2021

(65) Prior Publication Data

US 2022/0199582 A1 Jun. 23, 2022

Related U.S. Application Data

(60) Provisional application No. 63/130,318, filed on Dec. 23, 2020.

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3128* (2013.01); *H01L 25/50* (2013.01);
(Continued)

(58) Field of Classification Search
CPC ..... H01L 25/0657; H01L 25/50; H01L 24/19; H01L 24/24; H01L 24/32; H01L 24/33;
(Continued)

(56) References Cited

U.S. PATENT DOCUMENTS 7,061,125 B2 * 6/2006 Cho .................. H01L 24/82  
257/E21.512  
8,772,084 B2  7/2014 Lee et al.  
(Continued)

FOREIGN PATENT DOCUMENTS

CN 204118107 U 1/2015  
CN 209913231 U 1/2020  
(Continued)

OTHER PUBLICATIONS

Dube, Belinda, "Samsung 3D V-NAND 92-Layer Memory," *SystemPlus Consulting*, Sep. 2019, 22 pages.  
Silvagni, Andrea et al., "3D NAND Flash Based on Planar Cells," *Computers* 2017, 6, 28; doi: 10.3390, 15 pages.

*Primary Examiner* — Jasmine J Clark  
(74) *Attorney, Agent, or Firm* — Seed IP Law Group LLP

(57) ABSTRACT

The present disclosure is directed to a package that includes a plurality of die that are stacked on each other. The plurality of die are within a first resin and conductive layer is on the first resin. The conductive layer is coupled between ones of first conductive vias extending into the first resin to corresponding ones of the plurality of die. The conductive layer and the first conductive vias couple ones of the plurality of die to each other. A second conductive via extends into the first resin to a contact pad of the substrate, and the conductive layer is coupled to the second conductive via coupling ones of the plurality of die to the contact pad of the substrate. A second resin is on and covers the first resin and the conductive layer on the first resin. In some embodiments, the first resin includes a plurality of steps (e.g., a stepped structure). In some embodiments, the first resin includes inclined surfaces (e.g., sloped surfaces).

20 Claims, 14 Drawing Sheets

(51) Int. Cl.
  *H01L 23/31* (2006.01)
  *H01L 25/00* (2006.01)
(52) U.S. Cl.
  CPC .............. *H01L 24/32* (2013.01); *H01L 24/33* (2013.01); *H01L 2224/32145* (2013.01); *H01L 2224/32225* (2013.01); *H01L 2224/33181* (2013.01); *H01L 2225/06562* (2013.01)
(58) Field of Classification Search
  CPC ..... H01L 24/82; H01L 24/97; H01L 23/3135; H01L 23/3128; H01L 21/50; H01L 21/56; H01L 2224/24145; H01L 2224/83191; H01L 2224/24225; H10B 80/00
  USPC .................................................. 257/686, 777
  See application file for complete search history.

(56) References Cited

U.S. PATENT DOCUMENTS

| | | |
|---|---|---|
| 8,981,573 B2 | 3/2015 | Tang et al. |
| 9,337,116 B2 | 5/2016 | Pagaila et al. |
| 9,385,094 B2 | 7/2016 | Tang et al. |
| 11,171,109 B2 * | 11/2021 | Yang ........................ H01L 24/82 |
| 2009/0283870 A1 | 11/2009 | Pagaila et al. |
| 2019/0198447 A1 | 6/2019 | Aleksov et al. |
| 2019/0279919 A1 | 9/2019 | Xu et al. |

FOREIGN PATENT DOCUMENTS

| | | |
|---|---|---|
| CN | 111066144 A | 4/2020 |
| CN | 111564419 A | 8/2020 |
| WO | 2012/060091 A1 | 5/2012 |

* cited by examiner

STACKED DIE PACKAGE INCLUDING A MULTI-CONTACT INTERCONNECT

BACKGROUND

Technical Field

The present disclosure is directed to a package including a plurality of stacked die coupled together with a multi-contact interconnect. The package includes a first resin on the plurality of die, and a second resin on the first resin.

Description of the Related Art

Generally, semiconductor device packages, stacked die packages, and other types of semiconductor packages include either a single die or multiple die that are on a substrate and covered by a resin (e.g., a molding compound, an encapsulant, or some other suitable material). The die on the substrate is generally coupled to electrical components (e.g., electrical traces, contact pads, etc.) in and on the substrate. The electrical components of the substrate may be coupled to the die by electrical wires or electrical traces that extend through the resin.

When the electrical components of the substrate are coupled to the die by electrical wires, the electrical wires may be formed by a wire bonding technique (e.g., wedge bonding, ball bonding, compliant bonding, extrusion formation technique, etc.). For example, when a ball bonding technique and an extrusion formation technique is utilized, a ball of conductive material is formed on the contact pad of the die and a wire is extruded from the ball to the contact pad of the substrate. The electrical wire formed by the ball bonding technique and the extrusion formation technique electrically couples the die to the substrate.

In some other situations, the electrical connections between the electrical components of the substrate and the die may be formed by first forming grooves and openings in the resin, the opening expose the contact pads of the substrate and the die. After the grooves and openings are formed, a conductive material is formed in the grooves by a plating technique coupling the contact pad of the substrate to the contact pad of the die.

BRIEF SUMMARY

Reducing the number of steps in these conventional processes to form semiconductor device packages such as stacked die packages reduces manufacturing costs. Furthermore, reducing the amount of material that is utilized to form electrical connections in semiconductor device packages reduces manufacturing costs of those semiconductor device packages as well.

Embodiments of semiconductor device packages and methods of manufacturing the embodiments of semiconductor device packages of the present disclosure or within the scope of the present disclosure at least address reducing the number of steps and the amount of material utilized to form electrical connections within the embodiments of semiconductor device packages. Embodiments in accordance with the present disclosure are directed to at least stacked die packages.

The present disclosure is directed to at least one embodiment of a stacked die package that includes a first resin, a second resin on the first resin, and a conductive layer that is between the first resin and the second resin. In other words, the conductive layer is on the first resin, and the second resin covers the first resin as well as the conductive layer.

The stacked die may include a first die on a substrate, a second die stacked on the first die, and the first resin on the substrate and encasing the first die and the second die. The second die is stacked on the first die such that the second die is offset relative to the first die. In other words, the first die has a first end and the second die has a second end that extends past the first end. The first resin has a stepped structure (e.g., at least one step or a plurality of steps) that overlies the first and second die.

In some embodiments, the stacked die are coupled together with the conductive layer. A first conductive via extends into the first resin to the first die, a second conductive via that extends into the first resin to the second die, and a third conductive via that extends into the first resin to the substrate. The conductive layer is on the stepped structure is coupled to and extends between the first, the second, and the third conductive vias. The conductive layer electrically couples the first, second, and third conductive vias to each other, which electrically couples the first die, the second die, and the substrate to each other. The conductive layer may be formed with a Laser Direct Structuring (LDS) process that utilizes an LDS compatible material for the first resin.

In an alternative embodiment, a first resin has an inclined surface that overlies a first die and a second die. A first conductive via extends into the inclined surface to the first die, a second conductive via that extends into the inclined surface to the second die, and a third conductive via that extends into the first resin to the substrate. A conductive layer is on the inclined surface and electrically couples the first, second, and third conductive vias to each other.

Methods of forming the stacked die packages within the present disclosure include utilizing a laser-direct-structuring (LDS) technique or process to form a conductive layer on a surface of a first resin and conductive vias that extend into the first resin. The LDS technique includes moving a laser along the surface of the first resin activating an additive within the first resin, and plating the activated additive at the surface of the first resin with a conductive material electrically coupling stacked die within the first resin to each other and a substrate.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1A:
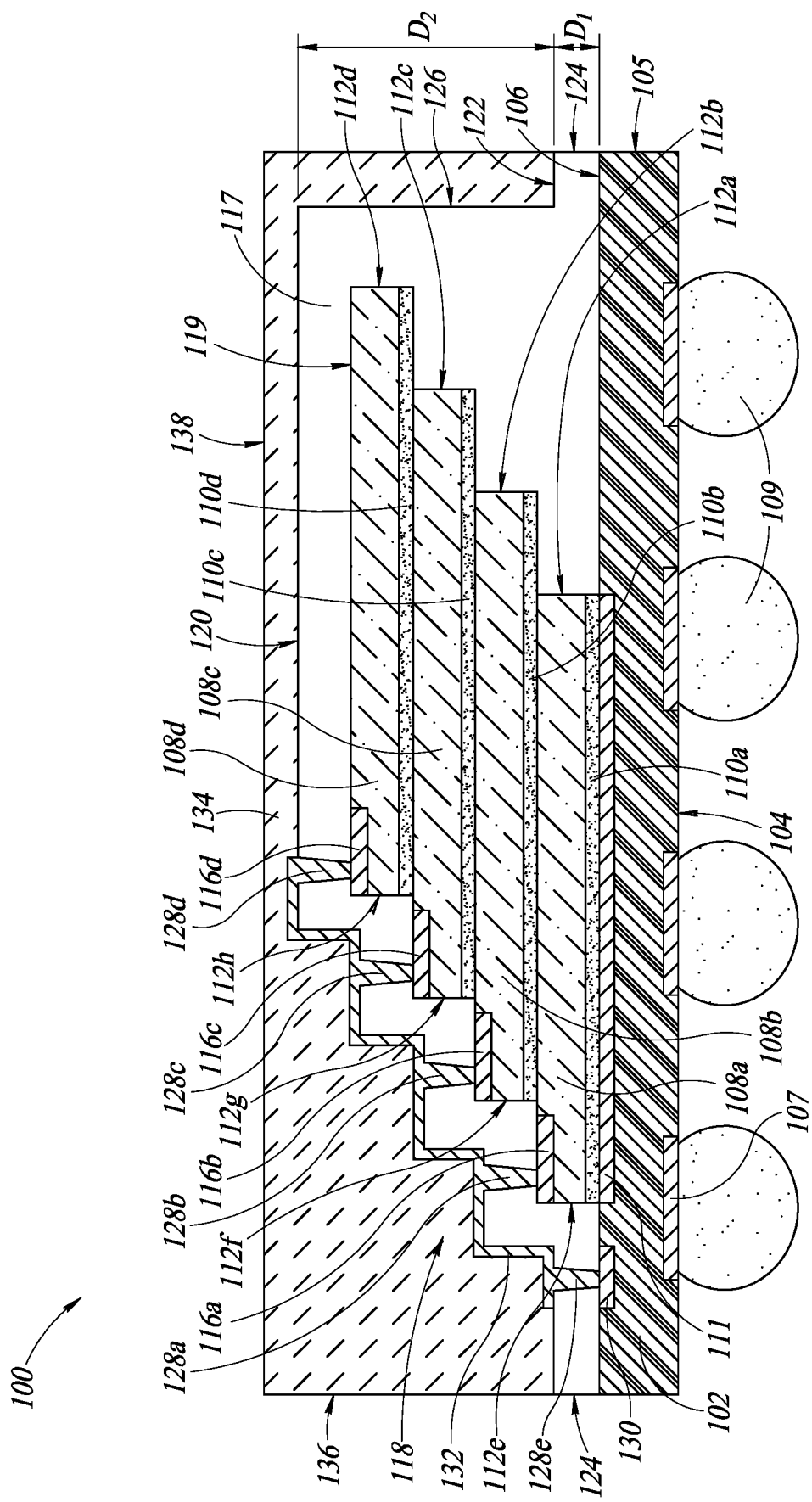
FIG. 1A is directed to a cross-sectional view of the embodiment of the stacked die package taken along line A-A in FIG. 1B.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "vertical," "horizontal," "lower," "upper," "top," "bottom," "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a package is manufactured in the real world, as nothing can be made perfectly equal or perfectly the same. In other words, substantially means that there may be some slight variation in actual practice and instead is made within accepted tolerances.

As used in this specification and the appended claims, the singular forms "a," "an," and "the" include plural referents unless the content clearly dictates otherwise.

As discussed earlier, embodiments of the present disclosure are directed to stacked die packages that include at least a first die on a substrate and a second die stacked on the first die. A first resin encases the first and second die. A conductive layer is on a surface of the first resin and electrically couples ones of a plurality of conductive vias extending into the first resin to the first die, the second die, and the substrate, respectively. The conductive vias and the conductive layer electrically couple the first die, the second die, and the substrate to each other. A second resin is on the first resin and covers the conductive layer protecting the conductive layer from an external environment that is outside the stacked die package.

In some embodiments, the first resin has a stepped structure (e.g., a step or a plurality of steps) on which the conductive layer is present. The conductive layer on the stepped structure has the same or similar stepped structure as the first resin. The conductive layer couples ones of a plurality of die to each other.

Additionally or alternatively, the first resin has an inclined surface on which a conductive layer is present. The conductive layer on the inclined surface has the same or similar incline as the inclined surface of the first resin. The conductive layer couples ones of a plurality of die within the first resin to each other. The conductive layer may be formed utilizing a laser-direct-structuring (LDS) technique or process in which a laser is moved along a surface of the first resin activating an additive material within the first resin.

Some embodiments include a first conductive layer and a second conductive layer that are separate and distinct from each other. Both the first and second conductive layers are on a first resin and are covered by a second resin. Further, the first and second conductive layers are formed by an LDS technique or process. The first conductive layer may be stepped while the second conductive layer may be inclined.

Figure 1B:
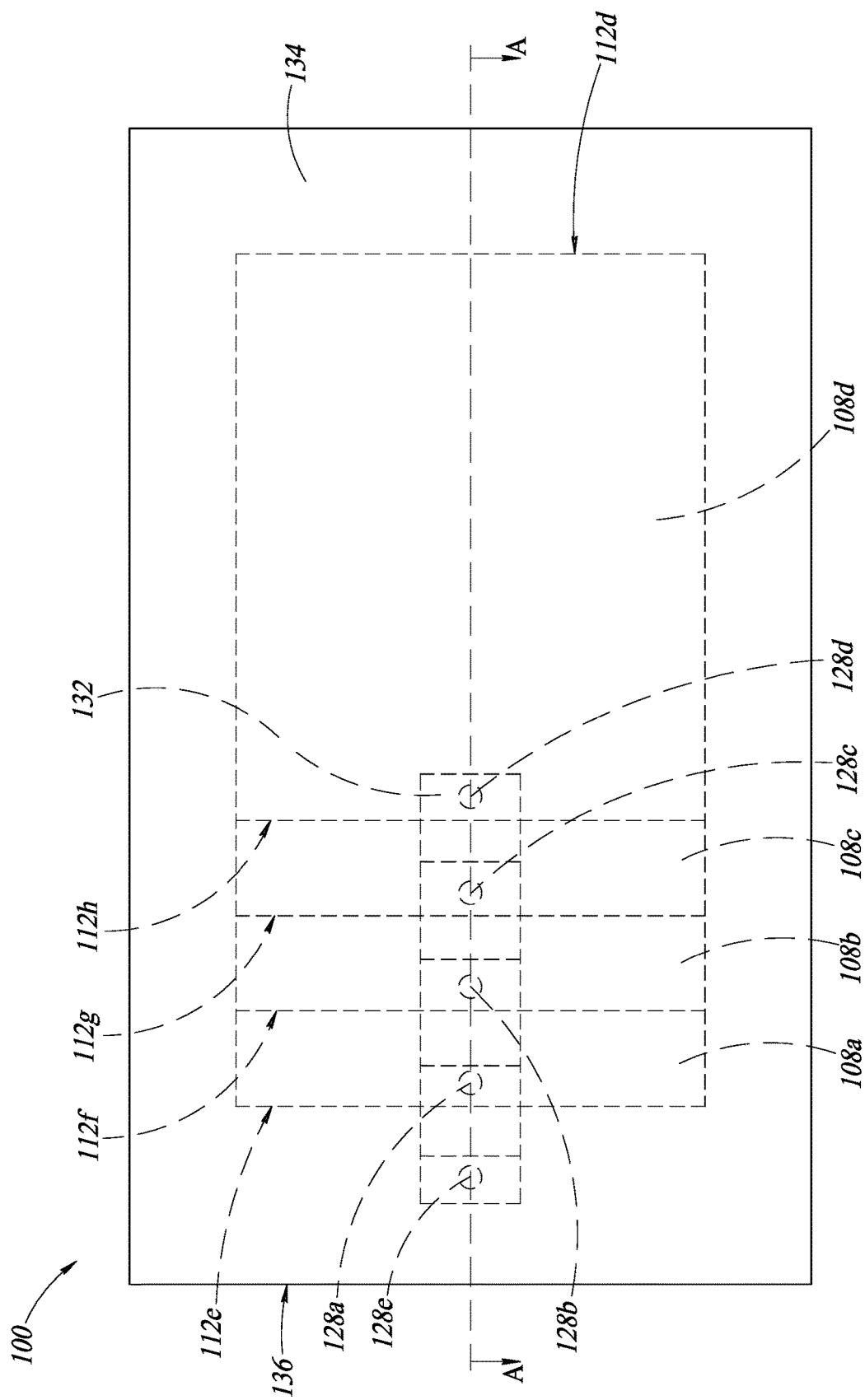
FIG. 1B is directed to a top-plan view of the embodiment of a stacked die package as shown in FIG. 1A.

FIG. 1A is directed to a cross-sectional view of the embodiment of the stacked die package 100 taken along line A-A in FIG. 1B. FIG. 1B is directed to a top-plan view of an embodiment of a stacked die package 100.

As shown in FIG. 1A, the stacked die package 100 includes a substrate 102 having a first surface 104, a second surface 106 opposite to the first surface 104, and a plurality of sidewalls 105 that extend from the first surface 104 to the second surface 106. The plurality of sidewalls 105 are transverse to the first surface 104 and the second surface 106.

The substrate 102 further includes a plurality of conductive pads 107 that are at the first surface 104 of the substrate 102. The conductive pads 107 may be bonding pads, mounting pads, or some other suitable pad or connection for coupling the stacked die package 100 to an external electrical component (e.g., a package, a die, a printed circuit board (PCB), etc.) or for mounting the stacked die package 100 within an electronic device (e.g., computer, smartphone, tablet, television, calculator, etc.). A plurality of solder balls 109 are coupled to the conductive pads 107, and the plurality of solder balls 109 are utilized to form electrical connections to the external electrical components or to the electronic device in which the stacked die package is mounted or utilized.

A plurality of die 108a, 108b, 108c, 108d (which may be referred to as 108a-108d henceforth within the present disclosure) are on the second surface 106 of the substrate 102. The plurality of die 108a-108d, which are a group of stacked die, includes a first die 108a, a second die 108b, a third die 108c, and a fourth die 108d in a stacked formation. The first die 108a is on the second surface 106 and is coupled to the second surface 106 by a first adhesive layer 110a. The second die 108b is on the first die 108a and is coupled to the first die 108a by a second adhesive layer 110b. The third die 108c is on the second die 108b and is coupled to the second die 108b by a third adhesive layer 110c. The fourth die 108d is on the third die 108c and is coupled to the third die 108c by a fourth adhesive layer 110d. The adhesive layers 110a-110d may be die attach films (DAF), glue, or some other adhesive material suitable for coupling the die 108a-108d to each other and the substrate 102.

The first die 108a is coupled to a pad 111 by the adhesive layer 110a, which is a conductive adhesive material electrically coupling the die 108a to the substrate 102. The pad 111 may be electrically coupled through an electrical connection (e.g., electrical trace, electrical via, etc.) that extends from the pad 111 to at least one of the plurality of pads 107 at the first surface 104 of the substrate 102.

In some embodiments, the adhesive layers 110a-110d may be made of a conductive adhesive material. In some embodiments, the adhesive layers 110a-110d may be made of a non-conductive adhesive material. In some embodiments, ones of the adhesive layers 110a-110d may be a conductive adhesive material and other ones of the adhesive layers 110a-110d may be a non-conductive adhesive material. Alternatively, in some embodiments, the adhesive layers 110a, 110b, 110c, 110d may be replaced by a number of die attach tape layers or a number of die attach films (DAFs).

In other words, the fourth die 108d (e.g., an upper die) is at the top of the plurality of die 108a-108d, and the first die 108a (e.g., a lower die) is at the bottom of the plurality of die 108a-108d based on the orientation of the stacked die package 100 in FIG. 1A. The second die 108b is sandwiched between the first die 108a and the third die 108c, and the third die 108c is sandwiched between the second die 108b and the fourth die 108d based on the orientation of the stacked die package 100 in FIG. 1A.

The first die 108a has a first end 112a, the second die has a second end 112b, the third die 108c has a third end 112c, and the fourth die 108d has a fourth end 112d. The second end 112b extends past the first end 112a such that the second end 112b overhangs the first end 112a. The third end 112c extends past the second end 112b such that the third end 112c overhangs the first and second ends 112a, 112b, respectively. The fourth end 112d extends past the third end 112c such that the fourth end 112d overhangs the first, second, and third ends 112a, 112b, 112c, respectively.

The first die 108a has a fifth end 112e opposite to the first end 112a. Each of the die includes an end stacked and shifted from the fifth end 112e of the first die 108a. For example, the second die 108b has a sixth end 112f opposite to the second end 112b, the third die 108c has a seventh end 112g opposite to the third end 112c, and the fourth die 108d has an eighth end 112h opposite to the fourth end 112d. The eighth end 112h of the fourth die 108d is on or otherwise shifted inward from the end 112g of the third die 108c. Said differently the seventh end 112g is closer to a sidewall 136. The sixth end 112f extends past the seventh end 112g and is positioned or aligned with a surface the first die 112a, that is more centrally positioned than a contact pad 116b. The fifth end 112e of the first die 108a is further from a central axis of the package than the sixth end 112f and is on the second surface 106 of the substrate 102.

Based on the earlier discussion with respect to the respective ends 112a-112h of the plurality of die 108a-108d, it will be readily appreciated that the plurality of die 108a-108d are stacked in an offset manner.

The first die 108a has a first pad 116a adjacent to the fifth end 112e. While illustrated as flush or coplanar with the fifth end 112e, the first pad 116a may be spaced in from the fifth end 112e. The second die 108b has a second pad 116b at the sixth end 112f that is closer to the sidewall 136 than the seventh end 112g. The third die 108d has a third pad 116c at the seventh end 112g that is adjacent to the eighth end 112h. The fourth die 108d has a fourth pad 116d at the eighth end 112h. The pads 116a-116d are exposed and are not covered by ones of the plurality of die 108a-108d stacked on each other. The pads 116a-116d remain exposed based on the offset manner in which the plurality of die 108a-108d are stacked. The offset manner was discussed in detail earlier, and accordingly, for the sake of simplicity and brevity of the present disclosure, the discussion of the offset manner in which the plurality of die 108a-108d are stacked will not be reproduced herein. A first resin 117 is on, encases, and surrounds the plurality of die 108a-108d. The first resin 117 may be a laser-direct-structuring (LDS) compatible resin, which may have the following non-limiting list of properties: (1) a coefficient of thermal expansion (CTE) ranging from approximately 10-parts-per-million (ppm)/degrees-Celsius (° C.) to 40-ppm/° C., (2) a flexure modulus ranging from 12-gigapascals (GPa) to 30-GPa at room temperature, and (3) an additive within the LDS compatible resin that is activated when exposed to a laser. Even though the first resin may have these properties, the first resin 117 may be another type of resin with different properties that is still suitable for utilization in the LDS process. The details of the LDS process will be discussed in greater detail with respect to FIGS. 6A-6D.

The first resin 117 is on the ends 112a-112h of the plurality of die 108a-108d and a surface 119 of the fourth die 108d that faces away from the first, second, and third die 108a, 108b, 108c. The first resin 117 completely and entirely covers the ends 112a-112h of the plurality of die 108a-108d, and completely and entirely covers the surface 119 of the fourth die 108d.

The first resin 117 has a plurality of steps 118, which may be a stepped structure or a staircase-like structure that is integral the first resin 117. The plurality of steps 118 includes four steps (e.g., the upper step is at the top of the stacked die package 100 based on the orientation in FIG. 1A, the upper step extends up to a surface 120 of the first resin 117), which is the same number as the plurality of die 108a-108d. The plurality of steps 118 includes a plurality of first surfaces (substantially horizontal in this Figure) and a plurality of second surfaces (substantially vertical in this Figure). The first surfaces are transverse to the second surfaces. The vertical surfaces may be substantially perpendicular (i.e., 90-degrees) to the horizontal surfaces. In some other embodiments, each vertical surface may be transverse to a corresponding horizontal surface by an angle that is substantially 70-degrees, 80-degrees, 90-degrees, 100-degrees, 110-degrees, 120-degrees, and so forth.

The horizontal surfaces may be tread surfaces, tread portions, or some other suitable surface of the stepped structure 118. The vertical surfaces may be riser surfaces, riser portions, or some other suitable surface of the stepped structure 118.

In some embodiments, the plurality of steps 118 may include two steps, three steps, or any number of suitable steps. For example, if the stacked die package 100 has five stacked die, the plurality of steps 118 may include five steps; if the stacked die package 100 has six stacked die, the plurality of steps 118 may include six steps; if the stacked die package 100 has seven stacked die, the plurality of steps 118 may include seven steps; and so forth. While in these discussed options there is a one to one relationship with a plurality of die in a stacked die package, in some other embodiments, the stacked die package 100 may include four stacked die and the plurality of steps 118 may have two steps, three steps, five steps, and so forth, or the stacked die package 100 may include three stacked die and the plurality of steps 118 may include two steps, four steps, five steps, and so forth.

In some other embodiments, the plurality of steps 118 may be replaced with only a single step, which has a substantially L-shape like structure. In other words, if there is only a single step, the step includes a first tread portion (e.g., lower horizontal surface based on the orientation of the stacked die package 100 as shown in FIG. 1A), a second tread portion (e.g., upper horizontal surface based on the orientation of the stacked die package 100 as shown in FIG. 1A), and a riser portion (e.g., vertical surface transverse to the horizontal surfaces based on the orientation of the stacked die package 100 as shown in FIG. 1A) that extends from the first tread portion to the second tread portion.

The first resin 117 includes a central surface 120 and a peripheral surface 122 positioned outward from the central surface 120. The peripheral surface 122 is closer to the substrate 102 than the central surface 120. The peripheral surface 122 overlies and overlaps the substrate 102 and is spaced outwardly from the plurality of die 108a-108d. The central surface 120 overlies and overlaps ones of the plurality of die 108a-108d. The central surface 120 may be an upper surface, a raised surface, or some other type of surface that is positioned closer to the top of the stacked die package 100 than the peripheral surface 122 based on the orientation of the stacked die package 100 in FIG. 1A. The peripheral surface 122 may be a lower surface that is closer to the bottom of the stacked die package 100 than the central surface 120 based on the orientation of the stacked die package 100 in FIG. 1A The first resin 117 includes at least a first sidewall 124 and at least a second sidewall 126, both of which can be seen at the right-hand side of FIG. 1A. The first sidewall 124 extends from the second surface 106 of the substrate to the peripheral surface 122, and the second sidewall 126 extends from the peripheral surface 122 to the central surface 120. The first sidewall 124 is spaced outwardly from the second sidewall 126, and the second sidewall 126 is spaced inwardly from the first sidewall 124. The first sidewall 124 may be an external sidewall, an outer sidewall, or some other type of sidewall. The second sidewall 126 may be an internal sidewall, an inner sidewall, or some other type of sidewall. The first sidewall 124 may be one of a plurality of first sidewalls 124 that extend from the second surface 106 of the substrate to the peripheral surface 122. The second sidewall 126 may be one of a plurality of second sidewalls 126 that extend from the peripheral surface 122 to the central surface 120.

The first sidewall 124 at the right-hand side of FIG. 1A has a first dimension $D_1$ that extends from the second surface 106 to the peripheral surface 122, and the second sidewall 126 on the right-hand side of FIG. 1A has a second dimension $D_2$ that extends from the peripheral surface 122 to the central surface 120. The first dimension $D_1$ is less than the second dimension $D_2$.

In some embodiments, ones of a plurality of first sidewalls 124 may have the first dimension $D_1$. In some embodiments, ones of a plurality of first sidewalls 124 may have the first dimension $D_1$ and other ones of the first sidewalls 124 may have a dimension that is larger than or smaller than the first dimension $D_1$.

In some embodiments, the first dimension $D_1$ may be substantially equal to the second dimension $D_2$. For example, in at least one other embodiment of the stacked die package 100 that only includes a single die on the substrate 102 covered by the first resin 117, the plurality of steps 118 are replaced by a single step of relatively the same size as each individual step as shown in FIG. 1A such that the first dimension $D_1$ of the first sidewall 124 may be substantially equal to the second dimension $D_2$ of the second sidewall 126. In at least another embodiment of the stacked die package 100, if the stacked die package 100 includes four die similar to as shown in FIG. 1A and if the plurality of steps 118 is replaced by only two steps of relatively the same size as each individual step in FIG. 1A, the first dimension $D_1$ may be substantially equal to the second dimension $D_2$.

In some embodiments, the first dimension $D_1$ of the first sidewall 124 may be greater than the second dimension $D_2$ of the second sidewall 126. For example, in at least one other embodiment of the stacked die package 100, if the stacked die package 100 includes four die similar to as shown in FIG. 1A and if the plurality of steps is replaced by one step of relatively the same size as each individual step in FIG. 1A, the first dimension $D_1$ may be substantially greater than the second dimension $D_2$.

A plurality of conductive vias 128a, 128b, 128c, 128d (which may be referred to as 128a-128d within the present disclosure henceforth) extend into the first resin 117. Ones of the plurality of conductive vias 128a-128d extend into ones of the plurality of steps 118 to ones of the plurality of pads 116a-116d of the plurality of die 108a-108d. A first conductive via 128a extends into a first one of the plurality of steps 118, which is the left-most step of the plurality of steps 118, to the first pad 116a. A second conductive via 128b extends into a second one of the plurality of steps 118, which is the step directly adjacent to the left-most step of the plurality of steps 118, to the second pad 116b. A third conductive via 128c extends into a third one of the plurality of steps 118, which is the step adjacent to the right-most step of the plurality of steps 118, to the third pad 116c. A fourth conductive via 128d extends into fourth one of the plurality of steps 118, which is the right-most step of the plurality of steps 118, to the fourth pad 116d. The fourth conductive via 128d extends into the central surface 120 of the first resin 117. A fifth conductive via 128e, which is at the left-hand side of the stacked die package 100, extends into the peripheral surface 122 of the first resin 117 to a pad 130 at the second surface of the substrate 102. The pad 130 may be coupled through an electrical connection (e.g., electrical traces, electrical vias, etc.) to at least one of the plurality of pads 107 at the first side 104 of the substrate 102.

The plurality of conductive vias 128a-128d are substantially vertical based on the orientation of the stacked die package 100 as shown in FIG. 1A. In some embodiments, the plurality of conductive vias 128a-128d may be at an angle instead of being substantially vertical based on the orientation of the stacked die package 100 as shown in FIG. 1A.

A conductive layer 132 is on the plurality of steps 118. The conductive layer 132 covers the horizontal and vertical surfaces of the plurality of steps 118. The conductive layer 132 is on the peripheral surface 122 and is on the central surface 120 of the first resin 117. The conductive layer 132 is on ends of the plurality of conductive vias 128a-128d and an end of the fifth conductive via 128e. The conductive layer 132 couples the plurality of conductive vias 128a-128d and the fifth conductive via 128e to each other. The conductive layer 132 is electrically coupled to the plurality of die 108a-108d through the first, second, third, and fourth conductive vias 128a-128d, respectively. The conductive layer 132 is electrically coupled to the pad 130 at the second surface 106 of the substrate 102 through the fifth conductive via 128e. The conductive layer 132 has the same or similar stepped structure or staircase-like structure as the plurality of steps 118 as the conductive layer 132 is on the horizontal and vertical surfaces of the plurality of steps 118.

The conductive layer 132 and the plurality of conductive vias 128a-128d may be a multi-contact interconnect structure coupling the plurality of pads 116a-116d of the plurality of die 110a-110d to each other and to the pad 130 of the substrate 102. The multi-contact interconnect structure may be a multi-contact interconnect stepped structure, a multi-contact interconnect staircase-like structure, a multi-contact staircase structure, a conductive interconnect structure, a stepped conductive interconnect structure, a multi-contact interconnect, or some other suitable structure for coupling the plurality of stacked die 108a-108d to each other and the substrate 102.

A second resin 134 is on the conductive layer 132 and is on the first resin 117. The second resin 134 covers the conductive layer 132. The second resin 134 is on and covers the central surface 120, the peripheral surface 122, and the at least one second sidewall 126 of the first resin 117. The second resin 134 may be a molding compound, an epoxy, an encapsulant, a non-conductive resin, an insulating resin, a dielectric resin, or some other type of resin material. The second resin 134 includes a plurality of sidewalls 136, which includes at least one sidewall that is substantially coplanar and flush with the at least one first sidewall 124 of the first resin as well as one of the plurality of sidewalls 105 of the substrate 102. The second resin 134 includes a surface 138 that is transverse to the plurality of sidewalls 136 and extends between ones of the plurality of sidewalls 136.

In some embodiments, the second resin 134 does not cover the central surface 120, and instead the central surface 120 is exposed such that the central surface 120 is substantially coplanar and flush with the surface 138 of the second resin 134, and the surface 138 is around the central surface 120. However, when the central surface 120 of the first resin 117 is substantially coplanar and flush with the surface 138 of the second resin 134, the conductive layer 132 is not present on the central surface 120 and the fourth via 128d is not present.

In some embodiments, the second resin 134 does not cover the conductive layer 132 such that electrical connections may be formed between the conductive layer 132 and external electrical components. For example, a solder material may be applied to a surface of the conductive layer 132 and an external die may be coupled to the solder material on the surface of the conductive layer 132.

In some embodiments, the second resin 134 is not present in the stacked die package 100. In other words, the second resin 134 is not present on the first resin 117 and the conductive layer 132.

Figure 2A:
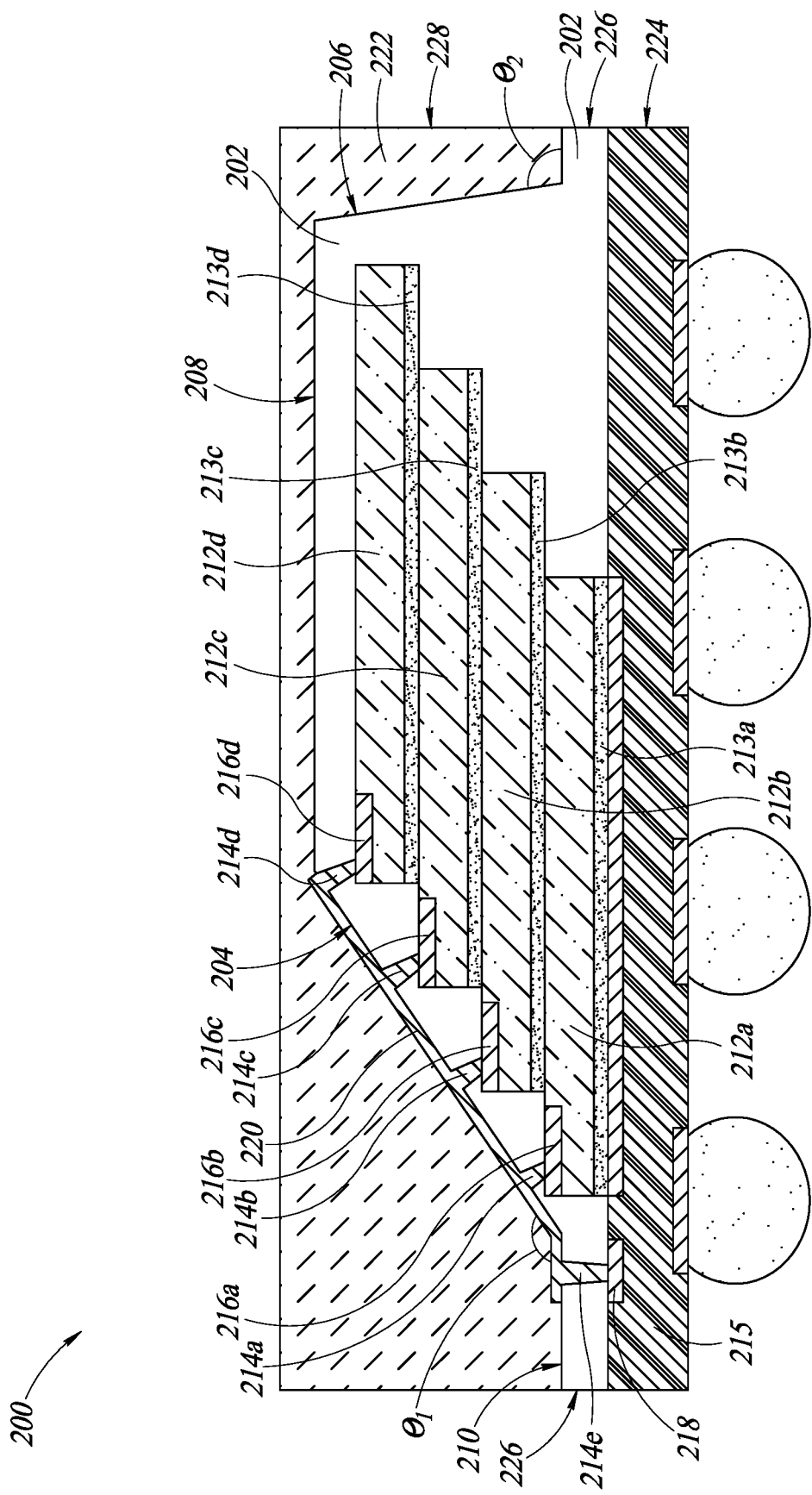
FIG. 2A is directed to a cross-sectional view of the alternative embodiment of the stacked die package taken along line B-B in FIG. 2B.
Figure 2B:
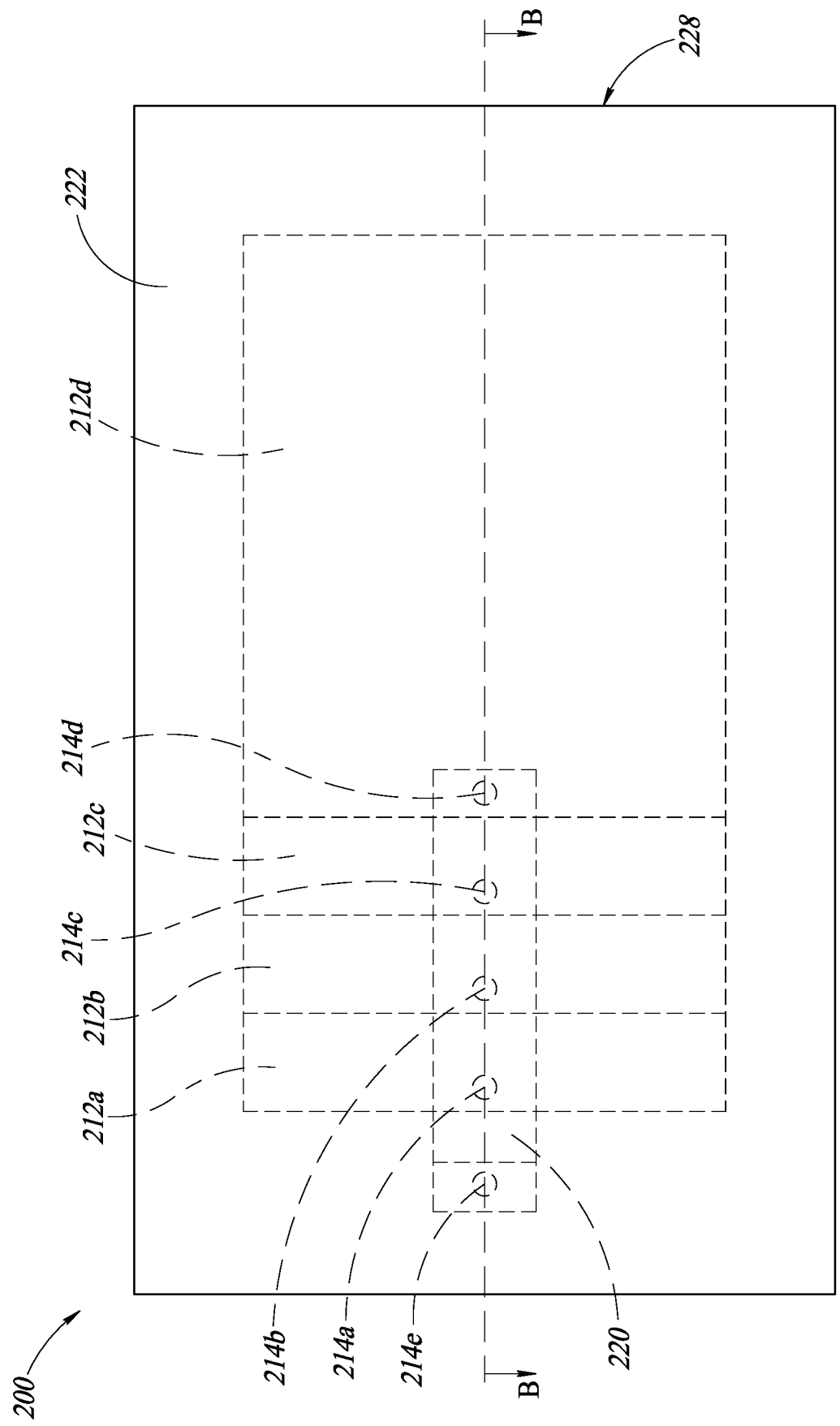
FIG. 2B is directed to a top-plan view of the alternative embodiment of the stacked die package as shown in FIG. 2A.

FIG. 2A is a cross-sectional view of an alternative embodiment of a stacked die package 200 taken along line B-B in FIG. 2B, which is a top plan view of the alternative embodiment of the stacked die package 200 shown in FIG. 2A. FIGS. 2A-2B are directed to the alternative embodiment of the stacked die package 200, which has features that are the same or similar as the stacked die package 100. For the simplicity and brevity sake of the present disclosure, only different or additional features of the stacked die package 200 with respect to the stacked die package 100 as shown in FIGS. 1A-1B will be discussed in further detail as follows within the present disclosure.

Unlike the first resin 117 in the stacked die package 100 as shown in FIG. 1A, a first resin 202 of the stacked die package 200 includes a first inclined surface 204 at a left-hand side of FIG. 2A and a second inclined surface 206 at a right-hand side of FIG. 2A. The first inclined surface 204 and the second inclined surface 206 are separated from each other by a central surface 208. The first and second inclined surfaces 204, 206 extend from a peripheral surface 210 of the first resin 202 to the central surface 208. The first and second inclined surfaces 204, 206 may be sloped surfaces, angled surfaces, or some other suitable surface with an incline. The central surface 208 and the peripheral surface 210 are the same or similar as the central surface 120 and the peripheral surface 122 of the first resin 117 as shown in FIG. 1A.

The first inclined surface 204 is at a first angle $\theta_1$ with respect to the peripheral surface 210 and the second inclined surface 206 is at a second angle $\theta_2$ with respect to the peripheral surface 210. The first angle $\theta_1$ may be 100-degrees, 110-degrees, 0.120-degrees, 130-degrees, 170-degrees, or some other suitable angle. The second angle $\theta_2$ may be 100-degrees, 110-degrees, 120-degrees, 130-degrees, 170-degrees, or some other suitable angle. The first angle $\theta_1$ and the second angle $\theta_2$ may be selected based on an orientation of a plurality of die 212a, 212b, 212c, 212d within the first resin 202. The plurality of die 212a-212d are the same or similar to the plurality of die 108a-108d. For example, the plurality of die 212a-212d are stacked in the same or similar offset manner as discussed earlier with respect to FIGS. 1A-1B.

The plurality of die 212a-212d are on a substrate 215, which is the same or similar as the substrate 102 as shown in FIG. 1A. The plurality of die 212a-212d are coupled together and stacked utilizing a plurality of adhesive layers 213a, 213b, 213c. 213d, which is the same or similar to the plurality of adhesive layers 110a-110d as shown in FIG. 1A. Similar to the first resin 117 as shown in FIG. 1A, the first resin 202 of the stacked die package 200 encases the plurality of die 212a-212d in the stacked die package 200.

Unlike the plurality of conductive vias 128a-128d as shown in FIGS. 1A-1B, a plurality of conductive vias 214a, 214b, 214c, 214d extend to corresponding ones of a plurality of pads 216a, 216b, 216c, 216d of the plurality of die 212a-212d at an angle such that the conductive vias 214a-214d are not only extending in a vertical direction based on the orientation of the stacked die package 200 in FIG. 2A but in a horizontal direction as well based on the orientation of the package as shown in FIG. 2A. Each of the conductive vias 214a-214d extends into the first resin 202 to a corresponding one of the plurality of pads 216a-216d. The plurality of conductive vias 214a-214d includes a first conductive via 214a, a second conductive via 214b, a third conductive via 214c, and a fourth conductive via 214d. The plurality of pads 216a-216d includes a first pad 216a of the first die 212a, a second pad 216b of the second die 212b, a third pad 216c of the third die 212c, and a fourth pad 216d of the fourth die 212d. In other words, a first conductive via 214a extends to the first pad 216a, the second conductive via 214b extends to a second pad 216b, the third conductive via 214c extends to a third pad 214c, and a fourth conductive via 214d extends to the fourth pad 214d.

A fifth conductive via 214e extends into the peripheral surface 210 on the left-hand side of FIG. 2B to a pad 218 of the substrate 215. The fifth conductive via 214e is the same or similar to the fifth conductive via 128e as shown in FIGS. 1A-1B. The pad 218 of the substrate 215 is the same or similar to the pad 130 of the substrate 102 as shown in FIG. 1A.

Unlike the conductive layer 132 with the stepped structure as shown in FIGS. 1A-B, a conductive layer 220 is on the first inclined surface 204 and on the peripheral surface 210 on the left-hand side of FIG. 2B. The conductive layer 220 has an incline of the first inclined surface 204. The conductive layer 220 extends between ones of the plurality of conductive vias 214a-214d and the fifth conductive via 214e. The conductive layer 220 couples the plurality of conductive vias 214a-214d and the fifth conductive via 214e together in the same or similar manner as the conductive layer 132 as shown in FIGS. 1A-1B.

A second resin 222 covers and is on the first inclined surface 204, the second inclined surface 206, the central surface 208, and the peripheral surface 210. The second 222 resin is the same or similar to the second resin 134 as shown in FIGS. 1A-1B. In some embodiments, the second resin 222 may not cover the central surface 208 as shown in FIG. 2B, and instead, the second resin 222 may be substantially coplanar and flush with the central surface 208.

The substrate 215 has a plurality first sidewalls 224, which is the same or similar as the plurality of sidewalls 105 of the substrate 102 as shown in FIGS. 1A-1B. The first resin 202 has at least one second sidewall 226, which is the same or similar to the at least one first sidewall 124 of the first resin 117 as shown in FIGS. 1A-1B. The second resin 222 has a plurality of third sidewalls 228, which is the same or similar as the plurality of sidewalls 136 of the second resin 134 as shown in FIGS. 1A-1B. One of the plurality of first sidewalls 224, the at least one second sidewall 226, and one of the plurality of third sidewalls 228 are substantially coplanar and flush with each other. For example, one of the first sidewalls 224, the at least one of the second sidewall 226, and one of the third sidewalls 228 are substantially flush with each other at the right-hand side of FIG. 2A. The sidewalls 224, 226, 228, respectively, make up sidewalls of the package 200.

Figure 3A:
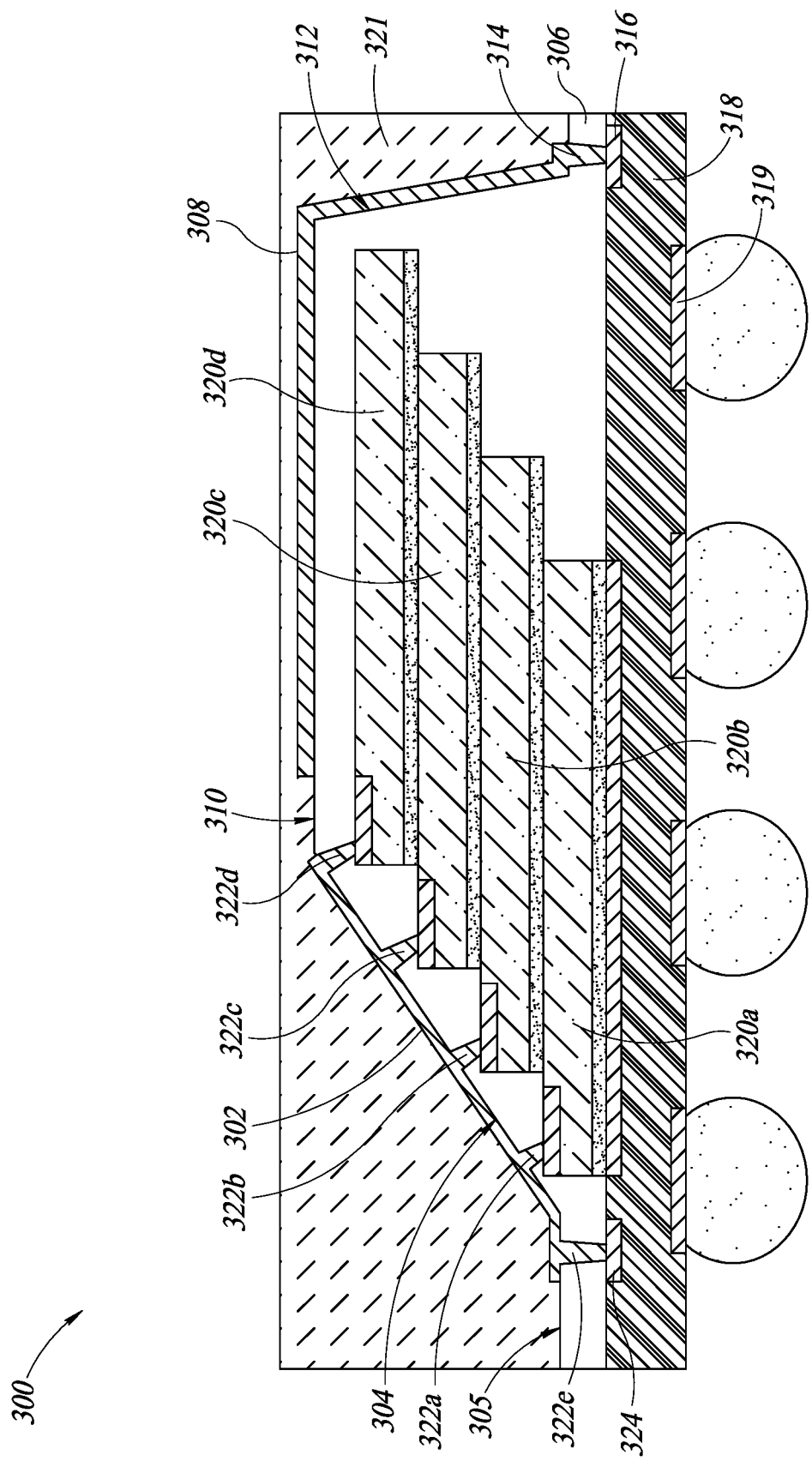
FIG. 3A is a cross-sectional view of an alternative embodiment of the stacked die package taken along line C-C in FIG. 3B.
Figure 3B:
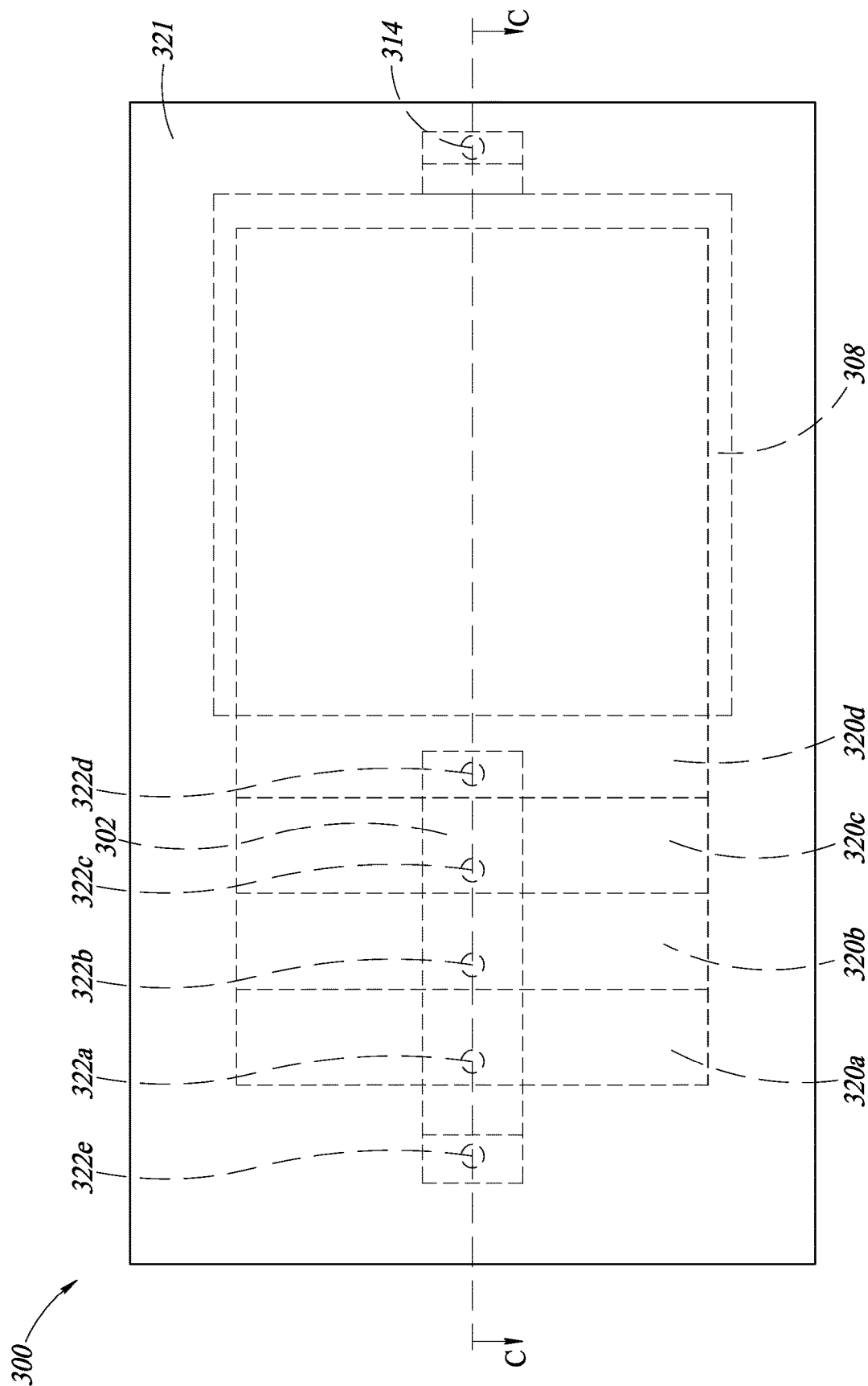
FIG. 3B is directed to a top-plan view of the alternative embodiment of the stacked die package.

FIG. 3A is a cross-sectional view of an alternative embodiment of a stacked die package 300 taken along line C-C in FIG. 3B, which is a top plan view of the alternative embodiment of the stacked die package 300 shown in FIG. 3A. FIGS. 3A-3B are directed to the alternative embodiment of the stacked die package 300, which has features that are the same or similar to the stacked die packages 100, 200. For the simplicity and brevity sake of the present disclosure, only different or additional features of the stacked die package 300 with respect to the stacked die packages 100, 200 as shown in FIGS. 1A-1B and 2A-2B will be discussed in further detail as follows.

Unlike the stacked die packages 100, 200 as shown in FIGS. 1A-1B and 2A-2B, the stacked die package 300 includes a first conductive layer 302 on a first inclined surface 304 of a first resin 306 and a peripheral surface 305 of the first rein 306 at a left-hand side of FIG. 3A. A second conductive layer 308 is on a central surface 310 of the first resin 306 and a second inclined surface 312 of the first resin 306 at a right-hand side of FIG. 3A. The first conductive layer 302 is the same or similar as the conductive layer 220 as shown in FIG. 2A. The first resin 306 is the same or similar to the first resin 222 as shown in FIG. 2A. The first inclined surface 304 is the same or similar to the first inclined surface 204 as shown in FIGS. 2A-2B. The peripheral surface 305 is the same or similar to the peripheral surface 210 as shown in FIGS. 2A-2B. The central surface 310 is the same or similar to the central surface 208 as shown in FIGS. 1A-1B. The second inclined surface 312 is the same or similar to the second inclined surface 206 as shown in FIGS. 2A-2B.

The second conductive layer 308 on the central surface 310 and the second inclined surface 312 of the first resin 306 is coupled to a conductive via 314 that extends into the peripheral surface 305 at the right-hand side of FIG. 3A. The conductive via 314 extends through the first resin 306 to a pad 316 of a substrate 318. The pad 316 may be coupled to one of a plurality of pads 319 on a side of the substrate 318 opposite to a side of the substrate on which the pad 316 is present. The one of the plurality of pads 319 to which the pad 316 is coupled may be grounded.

The second conductive layer 308 is an electromagnetic interference (EMI) shield layer that protects electrical components within the first resin 306 from external electrical signals. For example, the second conductive layer 308 absorbs an external electrical signal from outside the stacked die package 300, communicates the absorbed external electrical signal to the conductive via 314, then the absorbed external electrical signal is passed through the one of the plurality of pads 318 to which the pad 316 is coupled, and the external electrical signal exits the stacked die package 300. The external electrical signal does not reach the plurality of die 320a, 320b, 320c, 320d in the package 300. The plurality of die 320a-320d are the same or similar to the pluralities of die 108a-108d, 212a-212d as shown in FIGS. 1A-1B and 2A-2B in the packages 100, 200, respectively. For example, the plurality of die 320a-320d are stacked in the same or similar offset manner as shown in the packages 100, 200 of FIGS. 1A-1B and 2A-2B.

A second resin 321 covers the first conductive layer 302, the first resin 306, and the second conductive layer 308. The second resin 321 is the same or similar to the second resin 134, 222 as shown in FIGS. 1A-1B and 2A-2B.

The first conductive layer 302 is coupled to ones of the plurality of die 320a-320d through a plurality of conductive vias 322a, 322b, 322c, 322d, which is the same or similar to the plurality of conductive vias 212a-212d as shown in the package 200 in FIGS. 2A-2B. Each one of the plurality of conductive vias 322a-322d is coupled to a corresponding one of the plurality of die 320a-20d. The first conductive layer 302 is coupled to a conductive via 322e, which can be seen on the left-hand side of FIG. 3A, that extends into the first resin 306 to a contact pad 324 of the substrate 318. The conductive via 322e is the same or similar to the conductive vias 128e, 214e as in packages 100, 200 as shown in FIGS. 1A-1B and 2A-2B. The contact pad 324 is the same or similar to the contact pads 130, 218 as in packages 100, 200 as shown in FIGS. 1A and 2A.

Figure 4A:
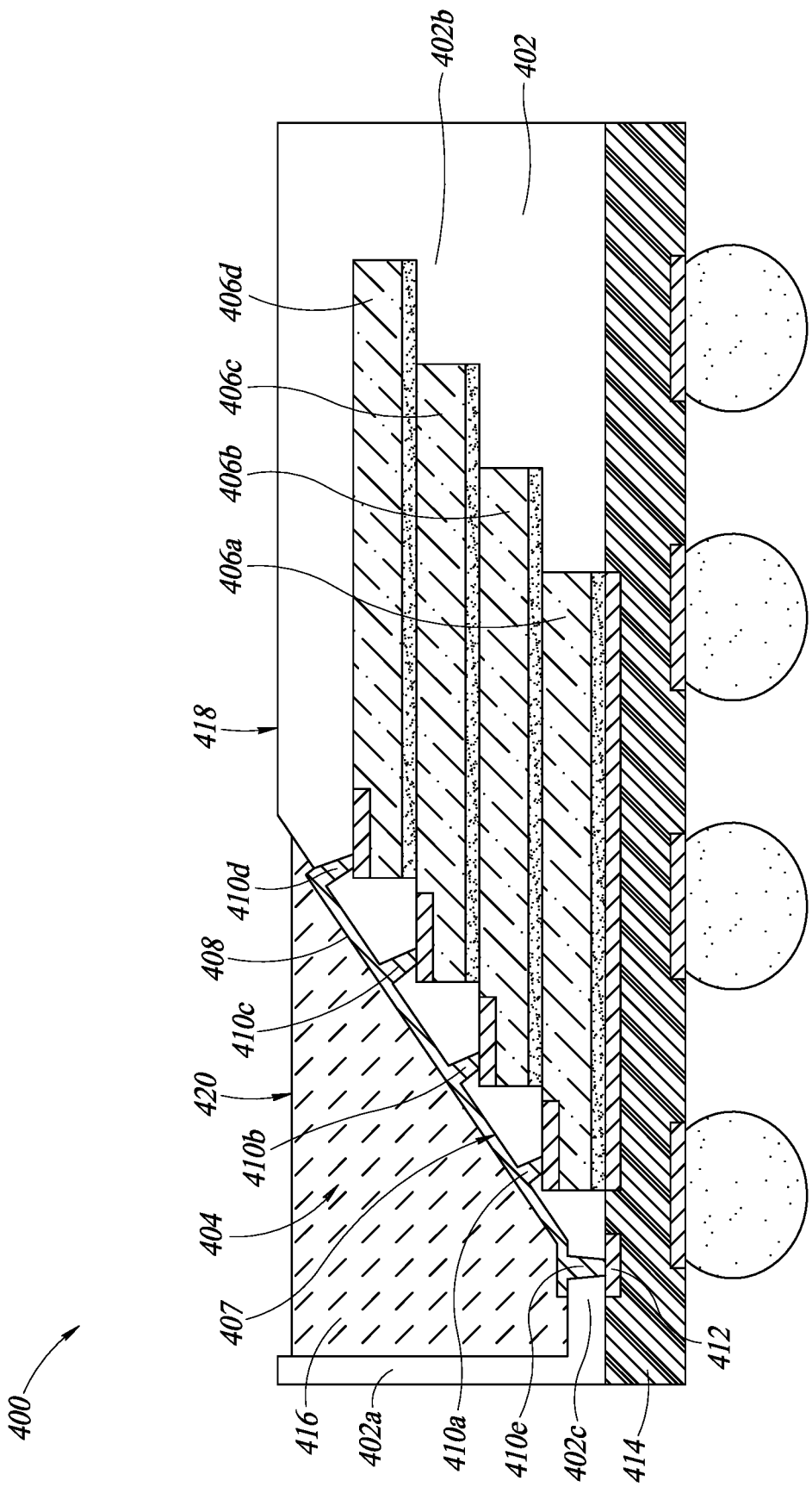
FIG. 4A is a cross-sectional view of an alternative embodiment of the stacked die package taken along line D-D in FIG. 4B.
Figure 4B:
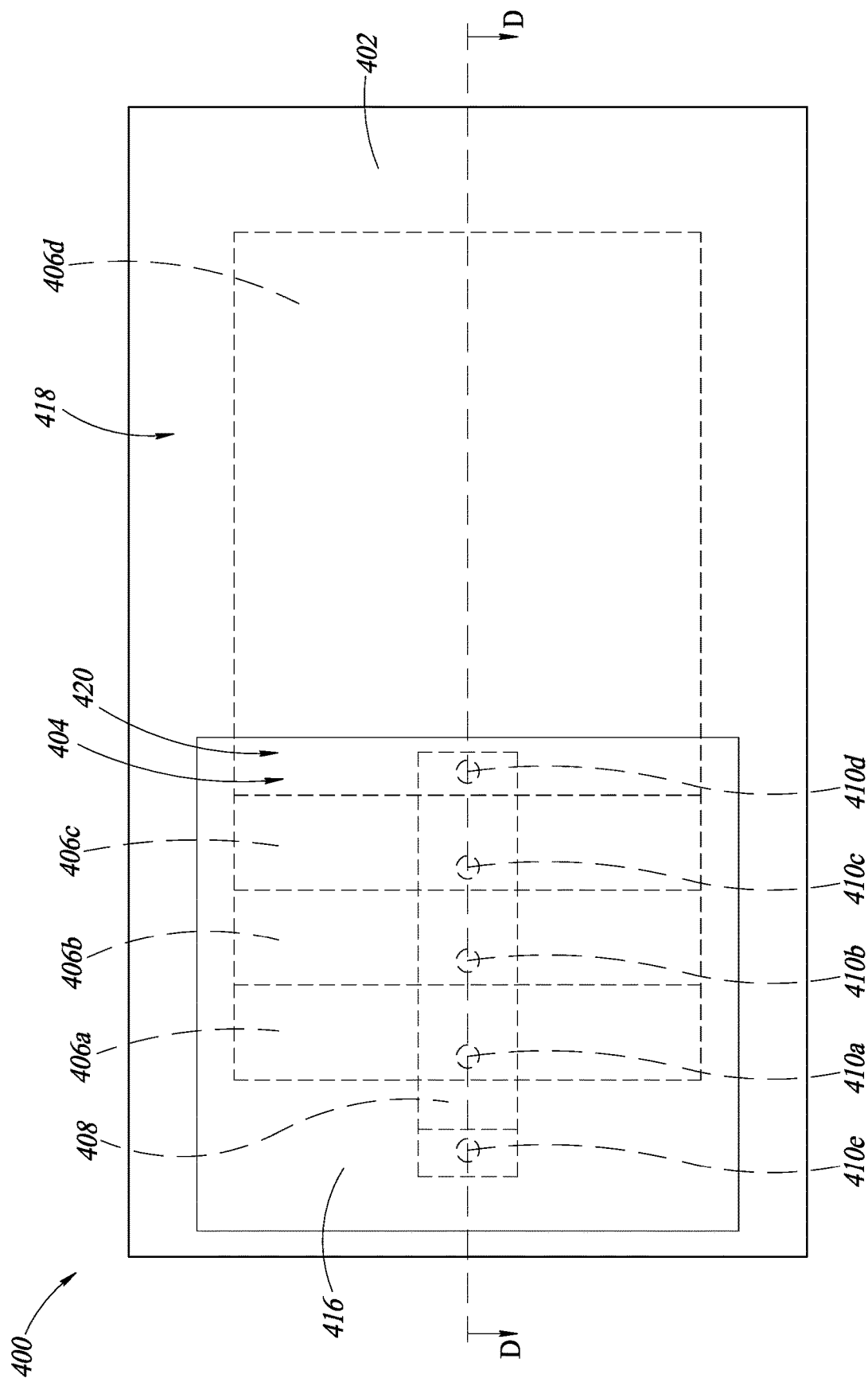
FIG. 4B is a top-plan view of the alternative embodiment of the stacked die package as shown in FIG. 4A.

FIG. 4A is directed to an alternative embodiment of a stacked die package 400 taken along a line D-D in FIG. 4B, which is a top plan view of the alternative embodiment of the package 400 as shown in FIG. 4A. FIGS. 4A-4B are directed to the alternative embodiment of the stacked die package 400, which has features that are the same or similar to the stacked die packages 100, 200, 300. For simplicity and brevity sake of the present disclosure, only different or additional features of the stacked die package 300 with respect to the stacked die packages 100, 200, 300 as shown in FIGS. 1A-1B, 2A-2B, and 3A-3B will be discussed in further detail as follows.

Unlike the first resin 117, 202, 306 as shown in FIGS. 1A-1B, 2A-2B, and 3A-3B, a first resin 402 has a reservoir 404, which is between a first portion 402a of the first resin 402 and a second portion 402b of the first resin 402. The first portion 402a may be a wall portion, a sidewall portion, a boundary portion, or some other type of portion of the first resin 402. The first portion 402a extends away from a substrate 414 on which the first resin 402 is present. The second portion 402b of the first resin 402 surrounds and encases a plurality of die 406a, 406b, 406c, 406d. The plurality of die 406a-406d are the same or similar to the pluralities of die 108a-108d, 212a-212d, 320a-320d in packages 100, 200, 300, respectively, as shown in FIGS. 1A-1B, 2A-2B, and 3A-3B. A third portion 402c of the first resin 402 extends from the first portion 402a to the second portion 402b. The first portion 402a, the second portion 402b, and the third portion 402c are integral the first resin 402 and integral each other. In other words, the first portion 402a, the second portion 402b, and the third portion are made of a single, continuous material of the first resin 402. The second portion 402b has an inclined surface 407 on which a conductive layer 408 is present. In other words, the conductive layer 408 is on and covers the inclined surface 407 of the first resin 402. The inclined surface 407 and the conductive layer 408 are within the reservoir 404.

The conductive layer 408 is the same or similar to the conductive layers 220, 302 as shown in the packages 200, 300, respectively, of FIGS. 2A-2B and 3A-3B. The conductive layer 408 is coupled to ones of the plurality of die 406a-406d through a plurality of conductive vias 410a, 410b, 410c, 410d that are each coupled to a corresponding one of the plurality of die 406a-406d. The plurality of conductive vias 410a-410d are the same or similar to the conductive vias 212a-212d, 322a-322d as in the packages 200, 300 of FIGS. 2A-2B and 3A-3B. For example, the plurality of conductive vias 410a-410d extend into the inclined surface 407 of the first resin 402. The conductive layer 408 is coupled to a conductive via 410e that extends through the third portion 402c of the first resin 402 to a contact pad 412 of a substrate 414. The conductive via 410e is the same or similar to the conductive vias 128e, 214e, 322e as in packages 100, 200, 300 as shown in FIGS. 1A-1B, 2A-2B, and 3A-3B. The contact pad 412 is the same or similar to the contact pads 130, 218, 324 as in the packages 100, 200, 300 as shown in FIGS. 1A, 2A, and 3A. The substrate 414 is the same or similar as the substrates 102, 215, 318 as in packages 100, 200, 300 as shown in FIGS. 1A-1B, 2A-2B, and 3A-3B.

The reservoir 404 is filled with a second resin 416, which is spaced apart from substrate 414 by the third portion 402c of the first resin 402. The first resin 402 includes a first surface 418 and the second resin 416 includes a second surface 420. The first surface 418 and the second surface 420 face away from the substrate 414. The first surface 418 is further away from the substrate 414 than the second surface 420. The second surface 420 is recessed within the first resin 402.

In some embodiments, the first surface 418 and the second surface 420 are substantially coplanar and flush with each other. In other words, the second surface 420 is not recessed within the first resin 402. In some embodiments, the second resin 416 covers the first surface 418 of the first resin 402, and the second surface 420 is further away from the substrate 414 than the first surface 418.

Figure 5:
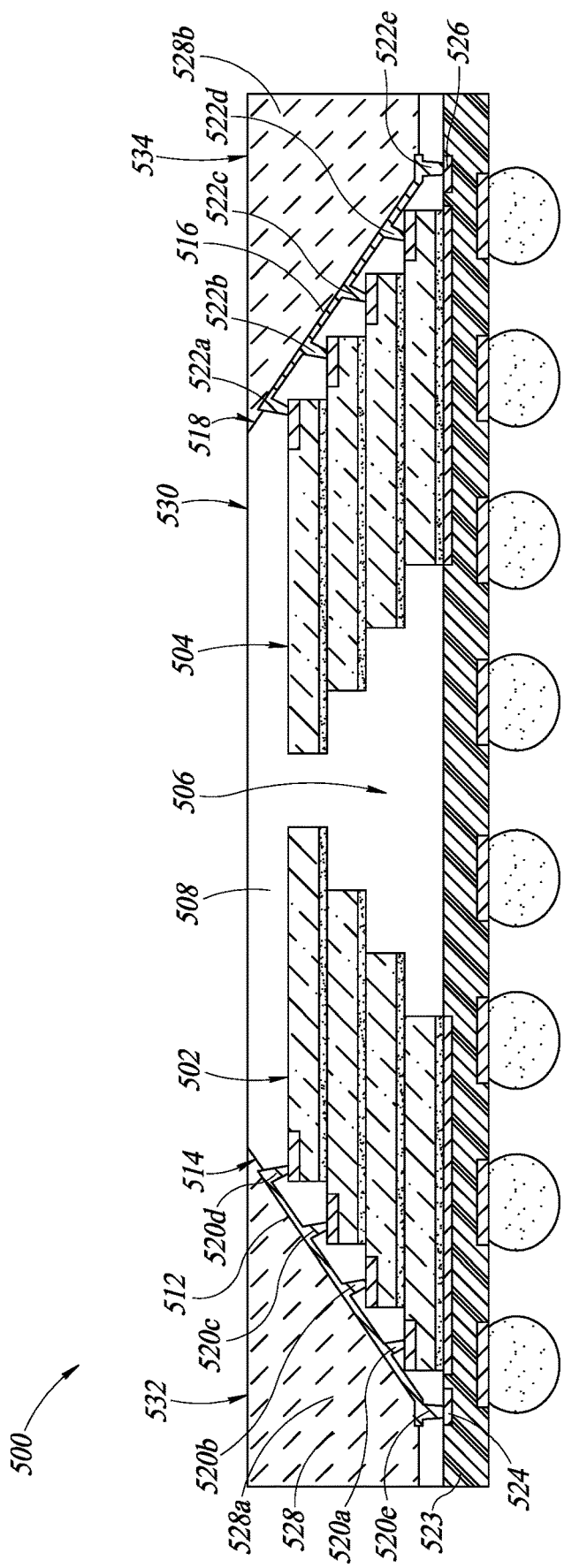
FIG. 5 is a cross-sectional view of an alternative embodiment of a stacked die package.

FIG. 5 is a cross-sectional view of a package 500 taken along a line similar to that of lines A-A, B-B, C-C, and D-D in FIGS. 1B, 2B, 3B, and 4B, respectively. The package 500 is the same or similar to the packages 100, 200, 300, 400 as shown in FIGS. 1A-1B, 2A-2B, 3A-3B, and 4A-4B. For the simplicity and brevity sake of the present disclosure, only different or additional features of the stacked die package 500 with respect to the stacked die packages 100, 200, 300, 400 as shown in FIGS. 1A-1B, 2A-2B, 3A-3B, and 4A-4B will be discussed in further detail as follows.

Unlike the packages 100, 200, 300, 400, the package 500 includes a first group of stacked die 502, which are closer to the left-hand side of FIG. 5, and a second group of stacked die 504, which are closer to the right-hand side of FIG. 5. The first group of stacked die 502 and the second group of stacked die 504 are mirror images of each other. In some embodiments, the first group of stacked die 502 and the second group of stacked die 504 may not be mirror images of each other. The first and second groups of stacked die 502, 504 are spaced apart from each other by an opening 506.

A first resin 508 covers and encases the first and second groups of stacked die 502, 504. The first resin 508 fills the opening 506 between the first and second groups of stacked die 502, 504. A first conductive layer 512 is on a first inclined surface 514 of the first resin, and a second conductive layer 516 is on a second inclined surface 518. The first conductive layer 512 and the first inclined surface 514 are opposite to the second conductive layer 516 and the second inclined surface 518. The first and second conductive layers 512, 516 are the same or similar to the conductive layers 220, 302, 408 as in packages 200, 300, 400 as shown in FIGS. 2A-2B, 3A-3B, and 4A-4B. The first and second inclined surfaces 514, 518 are the same or similar to the inclined surfaces 204, 304, 407 as in packages 200, 300, 400 as shown in FIGS. 2A, 3A, and 4A, respectively.

A first plurality of first conductive vias 520a, 520b, 520c, 520d couple the first conductive layer 512 to ones of the first group of stacked die 502, and a second plurality of second conductive vias 522a, 522b, 522c, 522d couple the second conductive layer 516 to ones of the second group of stacked die 504. The first and second pluralities of conductive vias 520a-520d, 522a-522d are the same or similar to the conductive vias 214a-214d, 322a-322d, 410a-410d as in the packages 200, 300, 400 as shown in FIGS. 2A-2B, 3A-3B, and 4A-4B.

The first and second conductive layers 512, 516 are coupled to a substrate 523. The first conductive layer 512 is coupled to a conductive via 520e that extends into the first resin 508 to a first contact pad 524 of the substrate 523 as seen on the left-hand side of FIG. 5. The second conductive layer 516 is coupled to a conductive via 522e that extends into the first resin 508 to a second contact pad 526 of the substrate 523 as seen on the right-hand side of FIG. 5. The conductive vias 520e, 522e are the same or similar to the conductive vias 128e, 214e, 322e, 410e as in packages 100, 200, 300, 400 as shown in FIGS. 1A-1B, 2A-2B, 3A-3B, and 4A-4B. The contact pads 524, 526 are the same or similar to the contact pads 130, 218, 324, 412 as in packages 100, 200, 300, 400 as shown in FIGS. 1A, 2A, 3A, and 4A.

A second resin 528 is on the first and second inclined surface 514, 518 of the first resin 508. The second resin 528 is on and covers the first and second conductive layers 512, 516. The second resin 528 is the same or similar to the second resins 134, 222, 322, 416 as in packages 100, 200, 300, 400 as shown in FIGS. 1A-1B, 2A-2B, 3A-3B, and 4A-4B. The second resin 528 includes a first portion 528a, which is on the left-hand side of FIG. 5, and a second portion 528*b*, which is on the right-hand side of FIG. 5. The first portion 528*a* is separated from the second portion 528*b* by the first resin 508.

The first resin 508 has a first surface 530 that faces away from the substrate 523. The first portion 528*a* of the second resin 528 includes a second surface 532 that faces away from the substrate 523. The second portion 528*b* of the second resin 528 includes a third surface 534 that faces away from the substrate 523. The first surface 530, the second surface 532, and the third surface 534 are substantially coplanar and flush with the each other forming a unitary or single surface. In some embodiments, the second resin 528 may be on and cover the first surface 530 of the first resin 508.

In some embodiments, the first portion 528*a* and the second portion 528*b* are two portions that are separate and distinct portions that are separated from each other by the first resin 508. In some embodiments, the first portion 528*a* and the second portion 528*b* are continuous and integral with each other as the second resin 528 surrounds the first resin 508.

In some embodiments, a die may be stacked on the first group of stacked die 502 and on the second group of stacked die 504. In other words, the die extends from the first group of the stacked die 502 to the second group of stacked die 504.

Figure 6A:
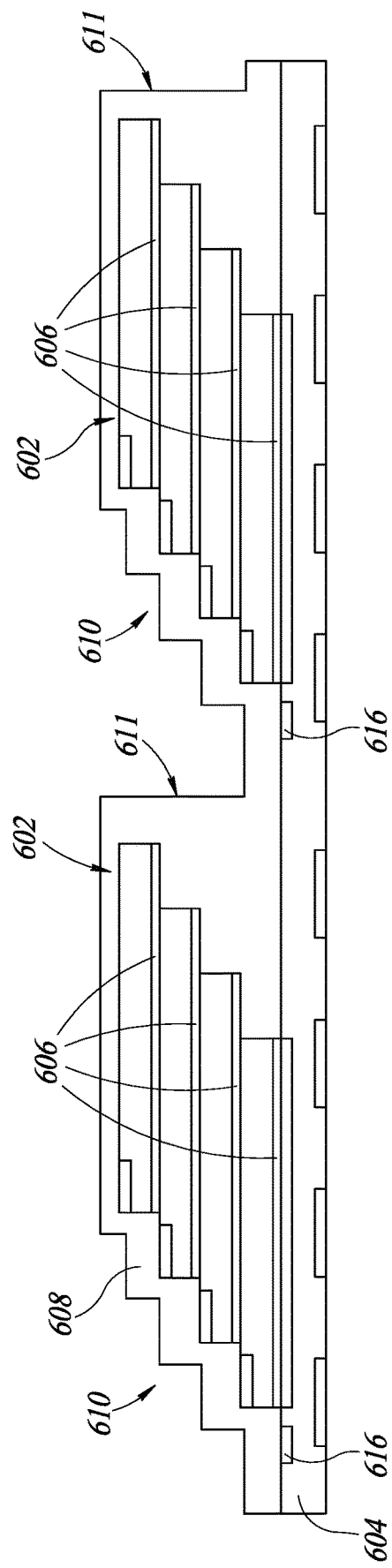
FIGS. 6A-6C are directed to an embodiment of a method of manufacturing the embodiment of the stacked die package as shown in FIGS. 1A and 1B.
Figure 6B:
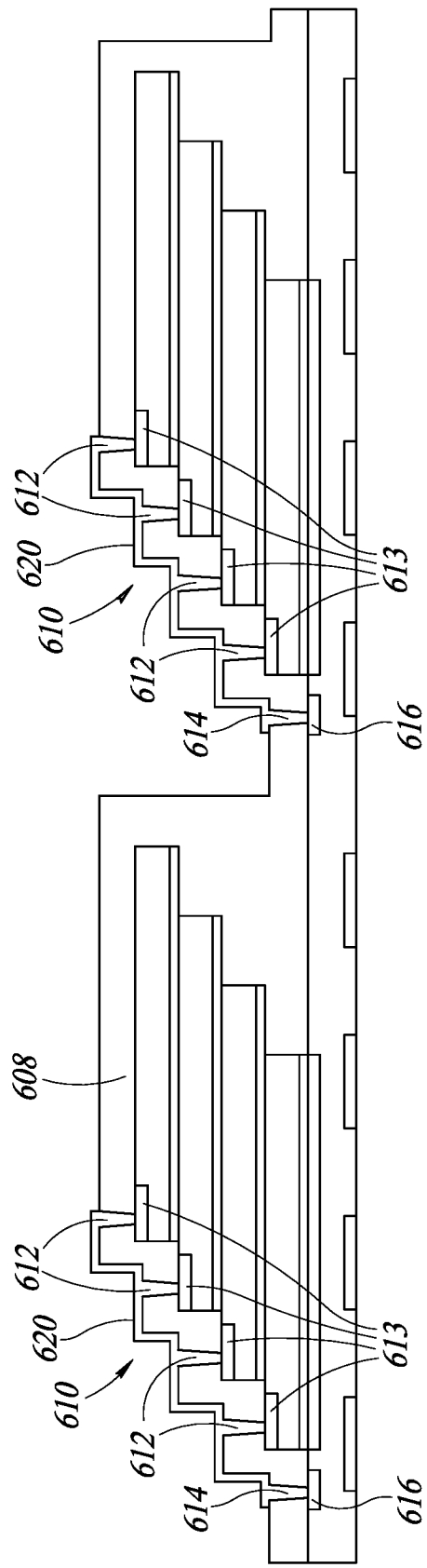
Figure 6C:
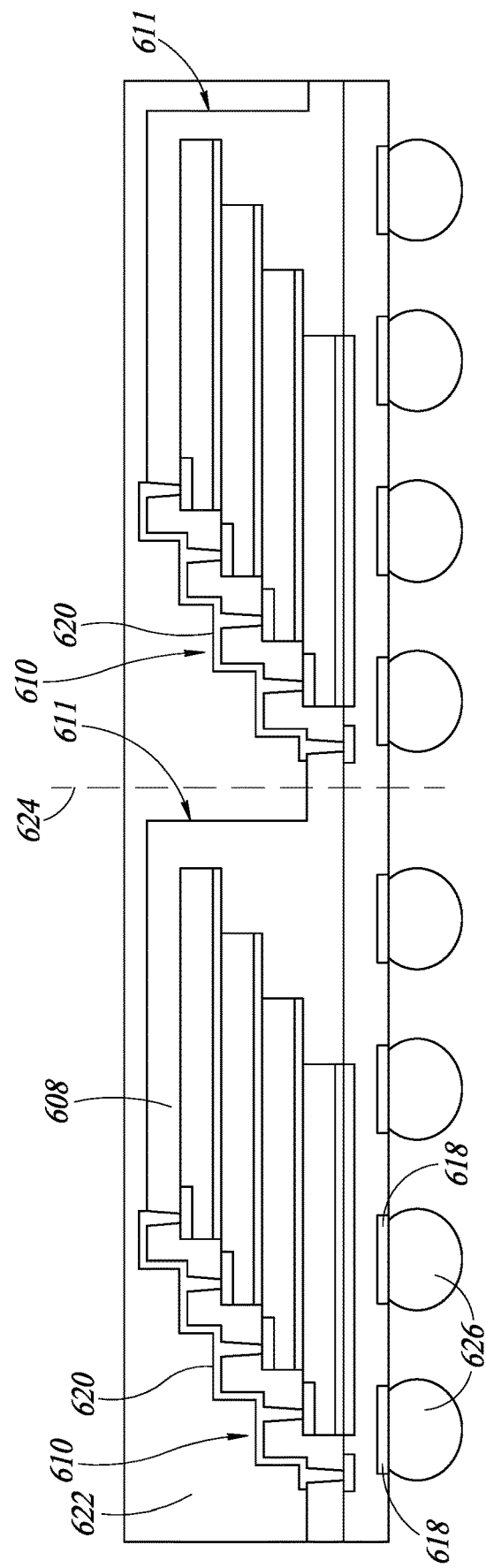

FIGS. 6A-6C are directed to cross-sectional views at various steps of an embodiment of a method of manufacturing the embodiment of the package 100 as shown in FIGS. 1A-1B. For the sake of brevity and simplicity of the present disclosure, the details previously discussed with respect to the package 100 will not reproduced herein. While the following description of the steps of the method of manufacturing the package 100 are provided as being completed in a specific order, it will be readily appreciated that the steps of the method of manufacturing the package 100 may be reorganized or rearranged for forming the package 100 utilizing an alternative embodiment of a method of manufacturing the package 100.

As shown in FIG. 6A, in the embodiment of the method of manufacturing of the stacked die package 100, groups of stacked die 602 are stacked on a substrate 604, which may be a wafer, a printed circuit board (PCB), a leadframe substrate, or a silicon substrate. The groups of stacked die 602 may be ones of an array of groups of stacked die on the substrate 604. The groups of stacked die 602 include a first group of stacked die on the left-hand side of FIG. 6A and a second group of stacked die on the right-hand side of FIG. 6A. As shown in FIGS. 6A-6D, each of the groups of stacked die 602 have four die. At least one of the groups of stacked die 602 are the same or similar to the plurality of die 108*a*-108*d* as shown in FIGS. 1A-1B. In other words, one of the groups of stacked die 602 corresponds to the plurality of die 108*a*-108*d* in the package 100 as shown in FIGS. 1A-1B. Adhesive layers 606 are utilized to couple the die of the groups of stacked die 602 to each other and to couple the groups of stacked die 602 to the substrate 604. The adhesive layers 606 are the same or similar to the adhesive layers 110*a*-110*d* as shown in FIGS. 1A-1B. The groups of stacked die 602 may be stacked on and coupled to the substrate 604 by a pick and place technique or some other suitable technique for stacking and coupling the groups of stacked die 602 onto the substrate 604.

In some embodiments, each of the groups of stacked die 602 may have two stacked die, three stacked die, five stacked die, or any number of stacked die as desired. In some embodiments, the groups of stacked die 602 stacked on the substrate 604 may be replaced by a single die at each of the locations at which each of the groups of stacked die 602 are positioned as shown in FIG. 6A.

After the groups of stacked die 602 are stacked on and coupled to the substrate 604, a first resin 608 is formed on the groups of stacked die 602. The first resin 608 is formed to include groups of steps 610, which are each the same or similar to the plurality of steps 118 of the package 100 as shown in FIGS. 1A-1B, and sidewalls 611, which are the same or similar to the second sidewall 126 of the package 100 as shown in FIGS. 1A-1B. The groups of steps 610 includes a first plurality of steps 610 closer to the left-hand side of FIG. 6A that correspond to the first group of stacked die 602 closer to the left-hand side of FIG. 6A, and a second plurality of steps 610 closer to the right-hand side of FIG. 6A that correspond to the second group of stacked die 602 closer to the right-hand side of FIG. 6A. In other words, each one of the groups of steps 610 corresponds to at least a corresponding one of the groups of stacked die 602.

The first resin 608 may be a molding compound, an encapsulant, an epoxy, or some other non-conductive material. The resin 604 is formed by a compression molding technique, an injection molding technique, or some other technique for forming the resin 604. For example, if an injection molding technique is utilized, a molding tool with protruding portions that are shaped or structured similarly to the groups of steps 610 and the sidewalls 611 is utilized to form the groups of steps 610. The molding tool is aligned over and with the pluralities of stacked die 602, and the first resin 608 is then injected between the molding tool and the substrate 604. The first resin 608 injected is formed on and covers the groups of stacked die 602. The first resin 608 is then allowed to cure between the molding tool and the substrate 604. The molding tool is then removed from the first resin 608 after the first resin 608 has cured forming the groups of steps 610 and the sidewalls 611 of the first resin 608.

In some embodiments, the first resin 608 may be formed on the pluralities of stacked die 602 without the groups of steps 610, and after the first resin 608 is cured, the first resin 608 is patterned by at least an etching technique, a lasering technique, or some other removal technique or combination of removal techniques suitable for removing portions of the first resin 608 forming the groups of steps 610.

As shown in FIG. 6B, after the groups of steps 610 in the first resin 608 are formed, first conductive vias 612, second conductive vias 614, and conductive layers 620 are formed. The first conductive vias 612 extend into ones of the groups of steps 610 of the first resin 608 to contact pads 613 of ones of the groups of stacked die 602, and second conductive vias 614 extend into the first resin 608 to contact pads 616 of the substrate 604. The contact pads 616 of the substrate 604 are coupled to at least one of a plurality of contact pads 618 of the substrate 604 that are on an opposite side of the substrate 604 as a side at which the contact pads 616 of the substrate 604 are positioned. The first conductive vias 612 are the same or similar to the conductive vias 128*a*-128*d* as in the package 100 as shown in FIGS. 1A-1B, and the second conductive vias 614 are the same or similar to the conductive via 128*e* as in the package 100 as shown in FIG. 1A. The contact pads 616 are the same or similar as the pad 130 as shown in FIG. 1A. The contact pads 618 are the same or similar as the conductive pads 107 as shown in FIG. 1A.

The first conductive vias 612 and the second conductive vias 614 are formed by laser drilling into the first resin 608 utilizing a laser and then conducting an electroplating process. The conductive layers 620 are formed by moving the laser along and across surfaces of the groups of steps 610, which activates the additive material within the first resin 608, and then conducting the electroplating process.

Drilling into the first resin 608 forms openings or recesses that extend into the first resin 608. Each of the openings or recesses corresponds to at least one of the contact pads 613 of the groups of stacked die 602 or at least one of the contact pads 616 of the substrate 604. The openings or recesses expose ones of the contact pads 613, 616 of the groups of stacked die 602 and the substrate 604, respectively. Laser drilling into the first resin 608 to form the openings and recesses within the first resin 608 activates an additive material within the first resin 608 such that the additive material may be on and exposed along sidewalls of the openings or recesses. The additive material may be a material that is doped within the first resin 608. The additive material may be relatively non-conductive when within the first resin 608 as compared to after the first resin 608 has been exposed to a laser. When the first resin 608 is exposed to the laser, the additive material within the first resin 608 becomes electrically conductive such that the additive material may be utilized to attract another conductive material during an electroplating process or some other suitable plating process.

In one embodiment, the laser forms a micro-rough surface on which copper or another metal or metal alloy can attach during a metallization process. In some examples the additive material may be antimony, tin or a combination of antimony and tin. The additive may be encased in a polycarbonate resin.

Concurrently or successively with drilling the openings or recesses within the first resin 608, the laser is moved along the surfaces of the groups of steps 610 activating and exposing the additive material along the surfaces of the groups of steps 610 of the first resin 608. For example, the laser may drill a first opening or recess corresponding to the right-most first conductive via 612 in FIG. 6B, and then after drilling the first opening or recess corresponding to the right-most first conductive via 612, the laser may be moved along the right-most group of steps 610 to a position at which a second opening or recess corresponding to another one of the first conductive vias 612 is drilled out by the laser. These concurrent or successive movements of the laser activates and exposes the additive material within the openings or recesses and along surfaces of the first resin 608. For example, when drilling the openings or recesses, the additive material may cover the sidewalls of the openings or recesses extending into the first resin 608, and, when the laser moves along the surface of the groups of steps 610, the additive material may cover the surfaces of the groups of steps 610.

The additive material is a material that attracts and adheres to a conductive material during an electroplating process forming the conductive material on the additive material along the surfaces of the groups of steps 610 and within the openings or recesses in the first resin 608. The formation of the conductive material during this electroplating process forms the first conductive vias 612, the second conductive vias 614, and the conductive layer 620 concurrently.

As the laser moves along the surfaces of the groups of steps 610 of the first resin 608, the laser may remove a layer of the first resin 608. The removal the layer of first resin 608 will result in the conductive layers 620 completely or partially protruding outward from surfaces of the groups of steps 610 of the resin 608. In other words, in some embodiments, the conductive layers 620 will protrude outward from the surfaces of the groups of steps 610 of the first resin 608 such that the conductive layers 620 are not completely or entirely recessed within the first resin 608.

However, in some embodiments, the conductive layers 620 may be partially or fully recessed within the first resin 608. Whether the conductive layers 620 are partially or fully recessed within the first resin 608 depends upon a selected speed and time at which the laser moves along the surfaces of the groups of steps 610. For example, if the laser moves along at a first speed, the layer of first resin 608 that is removed may be relatively thicker than if the laser was moved along at a second speed that is faster than the first speed.

After the additive material within the first resin 608 has been activated, the first conductive vias 612, the second conductive vias 614, and the conductive layers 620 are formed by an electroplating process. During the electroplating process, a conductive material is attracted to and adhered to the additive material, which was previously activated and exposed by the laser as discussed earlier. During the electroplating process, the conductive material fills the openings or recesses forming the first and second conductive vias 612, 614. At the same time during the electroplating process, the conductive material is attracted to the additive material activated along the surfaces of the groups of steps 610. The conductive material adheres to the additive material along the surfaces of the groups of steps 610 forming the conductive layers 620. In other words, the first conductive vias 612, the second conductive vias 614, and the conductive layers 620 are all formed at relatively the same time during the electroplating process, which may be an electroplating bath process.

In some embodiments of methods of manufacturing the stacked die package 100, a resist material may be formed on the first resin 608 covering surfaces of the first resin. For example, the resist material may be formed on the surfaces of the group of steps 610. The resist material may be doped with an additive material similar to the additive material within the first resin 608. The resist material may be a photoresist material, a solder resist material, or some other type of suitable resist material.

As the laser moves along the resist material on the first resin 608, the laser removes portions of the resist material such that the laser reaches the first resin 608 and activates the additive material within the first resin 608 along surfaces of the first resin 608. The laser patterns the resist material with recesses and openings. After the resist material and the first resin 608 are patterned by the laser, the resist material may assist in forming the conductive vias 612, 614 within the first resin 608 and forming the conductive layers 620 at selected locations along the surfaces of the first resin 608. For example, the openings and recesses patterned by the laser in the resist material act as boundaries such that the conductive vias 612 614 and the conductive layers 620 are formed within openings and recesses of the resist material.

The openings and recesses in the resist material direct the conductive material during an electroplating process to form the conductive vias 612, 614 and the conductive layers 620 reducing the likelihood of unintended electrical connections being formed within the stacked die packages. For example, if the conductive material forming the conductive vias 612, 614 and the conductive layers 620 overflows, there may be electrical connections that are formed in the stacked die packages 100 that result in short circuiting or cross-talked between electrical connections within the stacked die packages 100.

In some embodiments of methods of manufacturing the stacked die packages 100, the resist material may be removed after forming the conductive vias 612, 614 and the conductive layers 620. In some embodiments of methods of manufacturing the stacked die packages 100, the resist material may remain after forming the conductive vias 612, 614 and the conductive layers 620, and the resist material may then be covered by a second resin 622.

After the conductive layers 620 and the conductive vias 612, 614 are formed, the second resin 622 is formed on the first resin 608 and on the conductive layers 620. The second resin 622 is formed to cover the groups of steps 610, the conductive layers 612, and the sidewalls 611. The second resin 622 may be the same or similar to the first resin 608 as discussed earlier. The second resin 622 may be formed in the same or similar manner as the first resin 608 is formed as discussed earlier. However, in some embodiments, the second resin 622 may be formed by a different process than how the first resin 608 is formed. Accordingly, for the sake of brevity and simplicity, the discussion of forming the second resin 622 is not discussed in full detail as it is readily appreciated how the second resin 622 is formed based on the earlier discussion with respect to forming the first resin 608.

However, unlike forming the first resin 608 with the molding tool having the protruding portions that are utilized to form the groups of steps 610 and the sidewalls 611, a molding tool for forming the second resin 622 does not include the protruding portions as the molding tool utilized to form the first resin 608 with the groups of steps 610 and the sidewalls 611.

After the second resin 622 is formed, a plurality of solder balls 626 are formed on ones of the plurality of contact pads 618. The solder balls 626 may be formed by a solder reflow technique or some other suitable technique for forming the solder balls 626 on the contact pads 618.

After the solder balls 626 are formed, the groups of stacked die 602, the substrate 604, the first resin 608, and the second resin 622 are singulated along a dotted line 624 to form the stacked die packages 100. The singulation step may be completed by a saw, a laser, or some other singulation tool to form the stacked die packages 100.

In some embodiments, the solder balls 626 may not be formed on the contact pads 618 before singulation, and instead, the solder balls 626 may be formed on the contact pads 618 after singulation.

Figure 7:
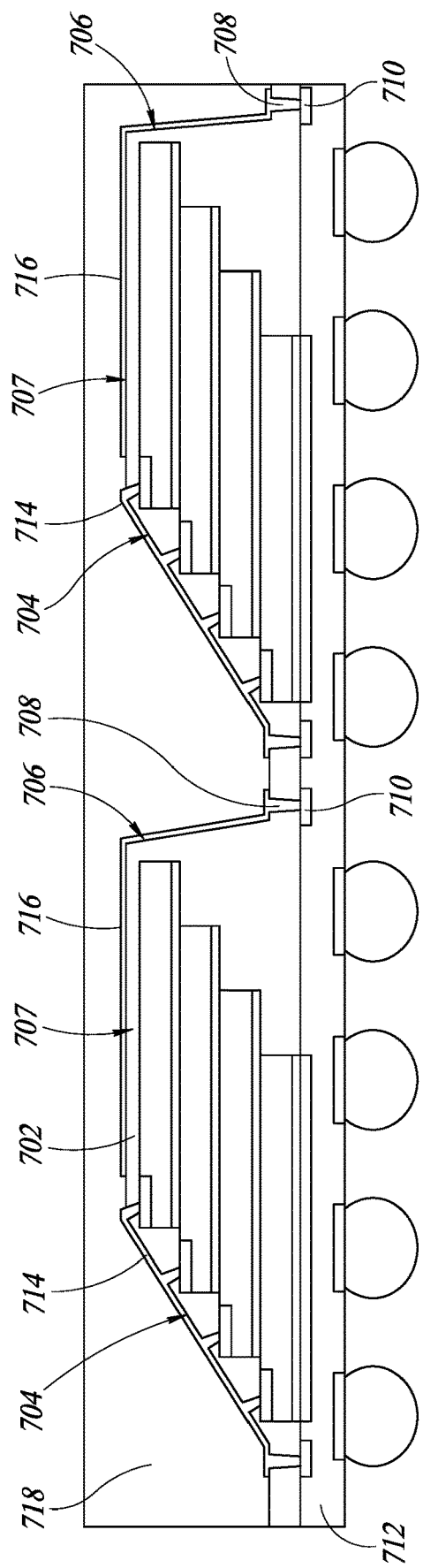
FIG. 7 is directed to an embodiment of a method of manufacturing the alternative embodiment of the stacked die package as shown in FIGS. 3A and 3B.

FIG. 7 is directed to a cross-sectional view at a step of an embodiment of a method of manufacturing the embodiment of the package 300 as shown in FIGS. 3A-3B. The method of manufacturing the package 300 is the same or similar to the method of manufacturing the package 100 as shown in FIGS. 6A-6D. Accordingly, for the sake of brevity and simplicity of the present disclosure, only differences or additional steps for the method of manufacturing the package 300 with respect to the method of manufacturing the package 100 as shown in FIGS. 6A-6D will be discussed in further detail as follows.

Unlike the method of manufacturing the package 100, a first resin 702 is formed having first inclined surfaces 704, second inclined surfaces 706, and third surfaces 707 that extend between a corresponding one of the first inclined surfaces 704 and a corresponding one of the second inclined surface 706. The first inclined surfaces 704 are the same or similar to the first inclined surface 304 of the package 300 as shown in FIG. 3A. The second inclined surfaces 706 are the same or similar to the second inclined surface 312 of the package 300 as shown in FIG. 3A. The third surfaces 707 are the same or similar to the central surface 310 of the package 300 as shown in FIG. 3A. The first inclined surfaces 704, the second inclined surfaces 706, and the third surfaces 707 of the first resin 702 are formed in the same or similar manner as the groups of steps 610 of the first resin 608 as shown and discussed with respect to FIGS. 6A-6D. The first resin 702 is the same or similar as the first resin 608 as shown and discussed with respect to FIGS. 6A-6D.

Unlike the method of manufacturing the package 100, a conductive via 708 is formed extending into the first resin 702 to a contact pad 710 of a substrate 712. The conductive via 708 is the same or similar to the conductive via 314 of the package 300 as shown in FIGS. 3A-3B. The conductive via 708 is formed in the same or similar manner as the first and second conductive vias 612, 614 as shown and discussed with respect to FIGS. 6A-6D.

Unlike the method of manufacturing the package 100, first conductive layers 714 are formed on corresponding ones of the first inclined surfaces 704, and second conductive layers 716 are formed on corresponding ones of the second inclined surfaces 706 and corresponding ones of the third surfaces 707.

The first conductive layers 714 are the same or similar to the first conductive layer 302 of the package 300 as shown and discussed with respect to FIGS. 3A-3B. The second conductive layers 716 are the same or similar to the second conductive layer 308 of the package 300 as shown and discussed with respect to FIGS. 3A-3B. The second conductive layers 716 are formed utilizing the same or similar process as forming the conductive layer 620 as shown and discussed with respect to FIGS. 6A-6C. The first conductive layers 714 are formed utilizing the same or similar process as forming the conductive layer 620 as shown and discussed with respect to FIGS. 6A-6C. The conductive vias 718 are the same or similar to the conductive vias 322a-322e of the package 300 as shown in FIGS. 3A and 3B.

In some embodiments, the conductive layers 714, 716 may fully or partially protrude outward from the first resin 702 in the same or similar manner as discussed earlier with respect to the conductive layers 610 with respect to FIGS. 6A-6C.

After the first and second conductive layers 714, 716 are formed, a second resin 718 is formed on the first resin 702, the first conductive layers 714, and the second conductive layers 716. The second resin 718 covers the first resin 702, the first conductive layers 714, and the second conductive layers 716. The second resin 718 is the same or similar to the second resin 321 of the package 300 as shown and discussed with respect to FIGS. 3A-3B.

It will be readily appreciated that a method of manufacturing the package 200 is the same or similar to the method of manufacturing the package 300 as shown and discussed with respect to FIG. 7. However, unlike the method of manufacturing the package 300, the method of manufacturing the package 200 does not include forming the conductive vias 708 and the second conductive layers 716.

Figure 8:
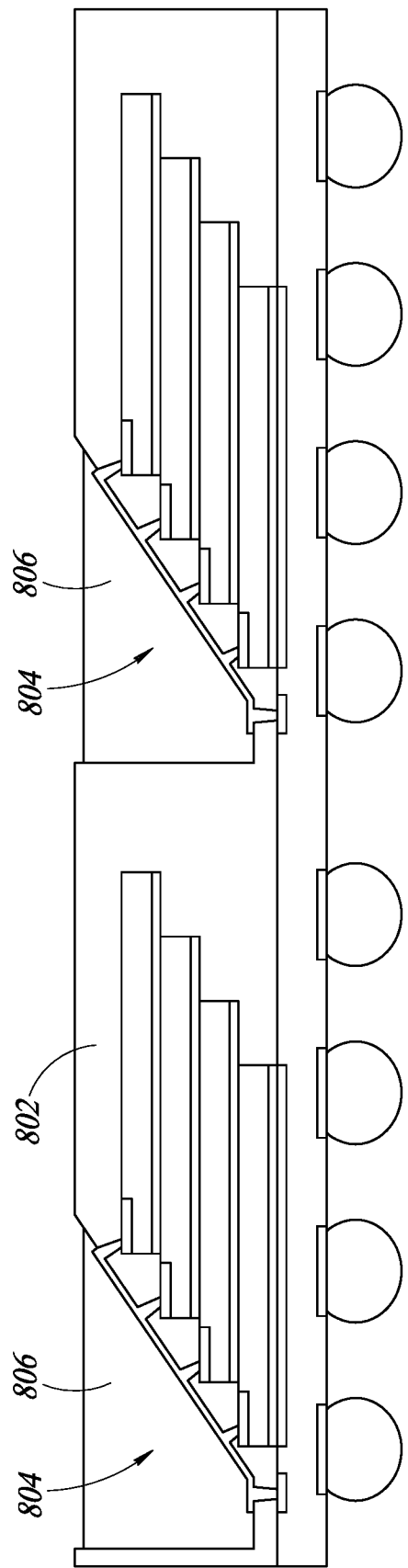
FIG. 8 is directed to an embodiment of a method of manufacturing the alternative embodiment of the stacked die package as shown in FIGS. 4A and 4B.

FIG. 8 is directed to a cross-sectional view at a step of an embodiment of a method of manufacturing the embodiment of the package 400 as shown in FIGS. 4A-4B. The method of manufacturing the package 400 is the same or similar to the methods of manufacturing the packages 100, 300 as shown in FIGS. 6A-6D and 7. Accordingly, for the sake of brevity and simplicity of the present disclosure, only differences or additional steps for the method of manufacturing the package 400 with respect to the methods of manufacturing the packages 100, 300 as shown in FIGS. 6A-6D and 7 will be discussed in further detail as follows.

Unlike the methods of manufacturing the packages 100, 300, a first resin 802 is formed including a plurality of reservoirs 804, which are the same or similar to the reservoir 404 of the package 400 as shown in FIGS. 4A-4B. The plurality of reservoirs 804 are formed in the same or similar process as the groups of steps 610 as shown and discussed with respect to FIG. 6D. The first resin 802 is the same or similar as the first resin 608 as shown and discussed with respect to FIGS. 6A-6D.

The pluralities of reservoirs 804 are filled with a second resin 806 that is the same or similar to the second resin 416 of the package 400 as shown in FIGS. 4A-4B. The second resin 806 is the same or similar to the second resins 622, 718 as shown and discussed with respect to FIGS. 6D and 7. The second resin 806 may be injected into, flowed into, or formed within the reservoir utilizing some other suitable technique.

The packages 100, 200, 300, 400, 500 of the present disclosure reduce an amount of conductive material to form conductive layers within the packages 100, 200, 300, 400, 500 as conductive layers within the packages 100, 200, 300, 400, 500 are formed utilizing an LDS process. In other words, a laser in an LDS process drills into a first resin and moves along surfaces of a first resin activates an additive material within the first resin that is utilized to form the conductive layers within the packages 100, 200, 300, 400, 500. After the additive material is activated, an electroplating process is carried out coupling a conductive material to the additive material forming the conductive vias extending into the first resin and forming conductive layers on the first resin within the packages 100, 200, 300, 400, 500. The use of the LDS process in combination with the electroplating process reduces the amount of material relative to the wire bonding formation process.

The packages 100, 200, 300, 400, 500 are less expensive to manufacture as compared to conventional packages that utilize wire bonding techniques to electrically couple stacked die within the conventional packages. Wire bonding techniques are expensive as forming wire bonds utilize expensive high-precision machinery that is expensive to maintain and utilize. Unlike the wire bonding technique, forming conductive layers within the packages 100, 200, 300, 400, 500 as shown in the present disclosure to couple ones of a plurality of stacked die is relatively inexpensive in comparison to forming wire bonding connections as a laser can be pulled along a surface of a first resin doped with an additive material, which is activated by the laser, and then conducting an electroplating process to couple a conductive material to the activated additive material. Accordingly, the high-precision machines utilized to form the wire bonds do not need to be utilized to electrically couple ones of the plurality of stacked die within the packages 100, 200, 300, 400, 500.

The packages 100, 200, 300, 400, 500 take less time to manufacture as compared to conventional packages that utilize wire bonding techniques to electrically couple stacked die within the conventional packages. As discussed earlier, wire bonding techniques require high-precision machines due to being a high-precision process, and accordingly, wire bonding formation takes a relatively long time as compared to other steps within the process of manufacturing conventional packages with wire bonds. This relative long amount of time reduces the units per hour (UPH) that may be manufactured utilizing the wire bonding techniques. Alternatively, forming the packages 100, 200, 300, 400, 500 utilizing the LDS process within the present disclosure to form conductive vias and conductive layers in the packages 100, 200, 300, 400, 500 results in a greater UPH of packages 100, 200, 300, 400, 500 that may be manufactured relative to forming the conventional packages with the wire bonding techniques.

The packages 100, 200, 300, 400, 500 are manufactured with greater reliability than conventional packages that include wire bonding electrical connections. Wire bonding formation generally is sensitive and is a step with relatively high likelihood of defects being formed. Furthermore, wire bonds are fragile and forming a resin covering the wire bonds may break or crack the wire bonds. However, unlike the wire bonds, the conductive layers directly on a surface of a resin reduces the likelihood of manufacturing defects or the effects of manufacturing defects. For example, if a wire bond cracks, generally the wire bond fully cracks and two portion break away from each other resulting in the wire bond not being functional. However, unlike the wire bond, the conductive layers within the present disclosure may only partially crack, resulting in the electrical connection formed by the conductive layers still being functional within the embodiment of the stacked die packages 100, 200, 300, 400, 500.

The packages 100, 200, 300, 400, 500 are generally more robust to expansion and contraction due to exposure to temperature changes than conventional packages that utilized wire bonding to form electrical connections within the conventional packages. For example, wire bonds of conventional packages are relatively more susceptible to cracking or breakage when exposed to changes in temperature as compared to conductive layers on of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a substrate;
    a first die on the substrate;
    a second die on the first die, the second die spaced apart from the substrate by the first die;
    a first resin on the substrate, the first die, and the second die, the first resin having a plurality of steps, and the first resin enclosing the first die and the second die;
    a first conductive layer electrically coupled to the substrate, the first die, and the second die, the first conductive layer being on the plurality of steps of the first resin and extends continuously along the plurality of steps; and
    a second resin on the first resin and on the first conductive layer.

2. The device of claim 1, wherein:
    the first resin includes a first sidewall; and
    the second resin includes a second sidewall, the second sidewall is coplanar with the first sidewall of the first resin.

3. The device of claim 1, wherein the first conductive layer further comprises:
    a first contact on the substrate;
    a second contact on the first die;

a third contact on the second die;

a first conductive via extending into the first resin to the first contact, the first conductive via electrically coupling the first conductive layer to the first contact;

a second conductive via extending into a first respective step of the plurality steps to the second contact, the second conductive via electrically coupling the first conductive layer to the second contact; and a third conductive via extending into a second respective step of the plurality of steps to the third contact, the third conductive via electrically coupling the first conductive layer to the third contact.

4. The device of claim 1, wherein the first resin encases the first die and the second die and the second resin encases the first die and the first conductive layer.

5. The device of claim 1, wherein the first resin is a laser-direct-structuring-compatible resin, the second resin being a different material than the first resin.

6. The device of claim 5, wherein:
the first resin includes a first sidewall and a second sidewall that are opposite to each other; and
the second resin includes a first sidewall and a second sidewall that are opposite to each other, the first sidewall of the first resin is coplanar with the first sidewall of the second resin.

7. The device of claim 6 wherein the first sidewall of the first resin has a first dimension in a first direction and the first sidewall of the second resin has a second dimension in the first direction, the first dimension being larger than the second dimension.

8. The device of claim 7, further comprising a second conductive layer between the first resin and the second resin, the second conductive layer being separate and distinct from the first conductive layer, the second conductive layer being electrically coupled to the substrate.

9. The device of claim 1, further comprising a reservoir in the first resin, the second resin is in the reservoir and is aligned with the first conductive layer.

10. The device of claim 9, wherein the first resin includes a pillar that forms an outer sidewall and an interior wall of the reservoir.

11. A device, comprising:
a substrate;
a first die on the substrate having a first surface and a plurality of first sidewalls;
a second die on the first surface, the second die having a second surface facing away from the first die and a plurality of second sidewalls;
a first laser-direct-structuring-compatible resin on the first surface, on the second surface, on the first sidewalls, and on the second sidewalls, the first resin having an angled surface; and a first conductive layer on the angled surface of the first resin, the first conductive layer being electrically coupled to the first die, the second die, and the substrate; and a second resin on the first resin, the second resin being a different material than the first resin.

12. The device of claim 11 wherein the first conductive layer is between the second resin and the first resin.

13. The device of claim 11, wherein:
the first resin entirely covers the second surface, the first sidewalls, and the second sidewalls; and
the first resin includes a plurality of outer sidewalls.

14. The device of claim 11, further comprising a second conductive layer on the first resin, the second conductive layer being separate and distinct from the first conductive layer, the second conductive layer being electrically coupled to the substrate.

15. The device of claim 11, wherein:
one of the plurality of sidewalls of the second die extends past the first die and forms an opening; and
the first resin entirely and completely fills the opening.

16. A device, comprising:
a substrate;
a first die on the substrate;
a second die on the first die and spaced apart from the substrate by the first die;
a first resin that is laser-direct-structuring-compatible on the substrate, the first die, the second die, and the first resin including one or more surfaces;
a first conductive layer electrically coupled to the substrate, the first die, the second die, and the conductive layer being on the one or more surfaces of the first resin; and
a second resin on the first resin and on the first conductive layer.

17. The device of claim 16, wherein the one or more surfaces is a plurality of surface with a staircase-like structure.

18. The device of claim 16, wherein the one or more surfaces includes an angled surface.

19. The device of claim 16, wherein the one or more surfaces includes an angled surface and another surface transverse to the angled surface.

20. The device of claim 19, further comprising a second conductive layer on the another surface, and wherein:
the second conductive layer is configured to, in operation, be an electromagnetic interference (EMI) shield; and
the first conductive layer is on the angled surface.

\* \* \* \* \*